(12) United States Patent
 Previtali

(10) Patent No.: US 8,796,118 B2
(45) Date of Patent: Aug. 5, 2014

(54) METHOD OF PRODUCING A THREE-DIMENSIONAL INTEGRATED CIRCUIT

(75) Inventor: Bernard Previtali, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 28 days.

(21) Appl. No.: 13/591,553

(22) Filed: Aug. 22, 2012

(65) Prior Publication Data

US 2013/0052805 A1 Feb. 28, 2013

(30) Foreign Application Priority Data

Aug. 25, 2011 (FR) ...................................... 11 57531

(51) Int. Cl.
*H01L 21/20* (2006.01)
*H01L 21/36* (2006.01)

(52) U.S. Cl.
USPC .............. 438/478; 257/E21.09; 257/E21.703; 438/142; 438/154

(58) Field of Classification Search
USPC ............. 257/E21.09, E21.703; 438/142, 154; 478/478
See application file for complete search history.

(56) References Cited

U.S. PATENT DOCUMENTS

| 4,472,729 A | 9/1984 | Shibata et al. |
| 6,624,046 B1 | 9/2003 | Zavracky et al. |
| 2004/0065884 A1 | 4/2004 | Bhattacharyya |
| 2004/0144979 A1 | 7/2004 | Bhattacharyya |
| 2004/0145399 A1 | 7/2004 | Bhattacharyya |
| 2005/0110159 A1* | 5/2005 | Oh et al. ........................ 257/777 |
| 2006/0148256 A1 | 7/2006 | Vinet et al. |
| 2007/0145367 A1 | 6/2007 | Chen et al. |
| 2008/0054359 A1 | 3/2008 | Yang et al. |
| 2008/0179678 A1* | 7/2008 | Dyer et al. .................... 257/351 |
| 2009/0020817 A1 | 1/2009 | Park et al. |
| 2010/0123202 A1* | 5/2010 | Hofmann ...................... 257/401 |

FOREIGN PATENT DOCUMENTS

EP 2 896 620 A1 7/2007

OTHER PUBLICATIONS

U.S. Appl. No. 13/591,407, filed Aug. 22, 2012, Nemouchi et al.
U.S. Appl. No. 13/591,485, filed Aug. 22, 2012, Enmouchi et al.
French Preliminary Search Report Issued Apr. 5, 2012 in Patent Application No. 1157531 (with English translation of Categories of Cited Documents).

* cited by examiner

*Primary Examiner* — Asok K Sarkar
(74) *Attorney, Agent, or Firm* — Oblon, Spivak, McClelland, Maier & Neustadt, L.L.P.

(57) ABSTRACT

Method of producing an integrated electronic circuit comprising at least the steps of:
  producing a substrate comprising at least a first and second layer of semiconductor between which at least a third layer of material is placed, then
  producing at least a first MOS device, an active area of which is formed in at least part of the first layer of semiconductor, then
  producing at least a second MOS device, an active area of which is formed in at least part of the second layer of semiconductor, the active area of the second MOS device being placed between a gate of the second MOS device and the active area of the first MOS device.

15 Claims, 30 Drawing Sheets

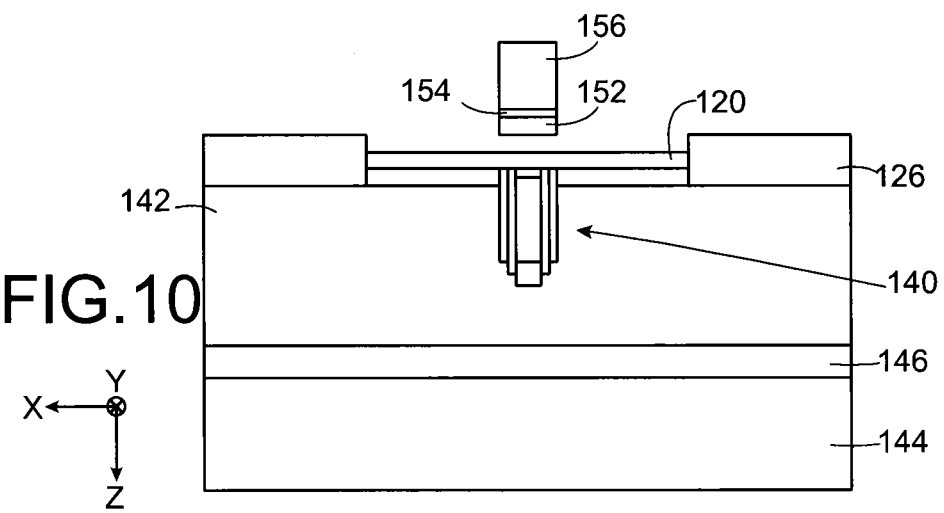
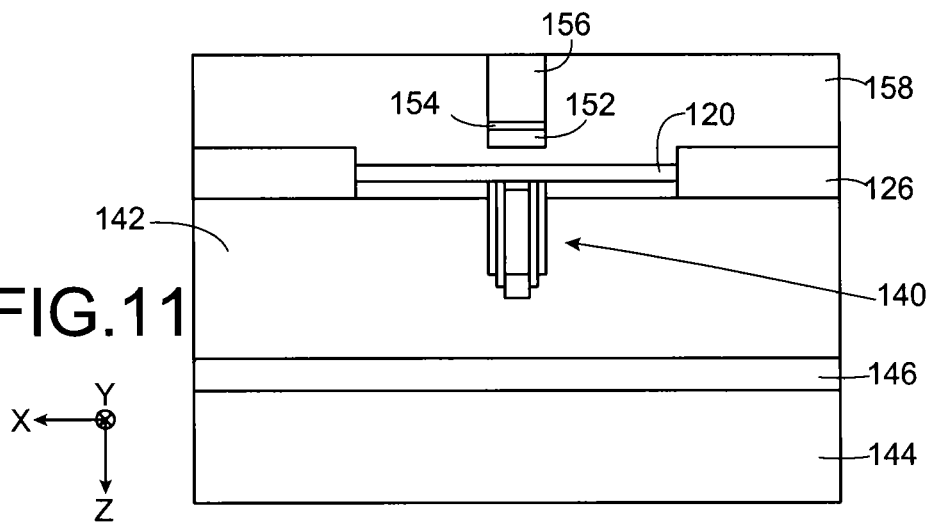

METHOD OF PRODUCING A THREE-DIMENSIONAL INTEGRATED CIRCUIT

TECHNICAL FIELD

The present invention concerns a method of producing a three-dimensional integrated electronic circuit, for example of the CMOS type, which can comprise MOS devices produced from semiconductive materials, for example monocrystalline.

One embodiment of the invention applies in particular to the production of an integrated circuit comprising MOS transistors or memory cells of the flash type.

PRIOR ART

Compared with a conventional integrated circuit produced from a single layer of semiconductor, a three-dimensional integrated circuit, that is to say one comprising several superimposed levels of electronic devices such as MOS transistors, makes it possible to increase the integration density of the electronic devices in the integrated circuit and also to reduce the mean propagation times of the signals in the electrical connections connected to the electronic components.

Such a three-dimensional integrated circuit can be obtained by parallel integration of the various levels. Such a parallel integration consists of implementing, in parallel and separately, the various levels of the integrated circuit from various substrates, and then bonding them one above the other. The bonding between the substrates can be implemented after having effected a siliciding of the active areas of the transistors, or after having effected first levels of electrical connections on each of the substrates. Electrical connections common to the various substrates are made after the bonding of the substrates together.

The document U.S. Pat. No. 6,624,046 B1 describes a three-dimensional circuit obtained by implementing such a parallel integration. Several circuits are manufactured separately from different substrates, and then stacked and connected together by vertical electrical connections. Each new circuit layer is transferred to the stack of circuits previously produced and holes are formed through the new circuit layer, opposite electrical contact areas previously defined on the stack. An electrically conductive material is then deposited in these holes in order to make the electrical connections between this new circuit layer and the rest of the stack.

During such parallel integration, the transfer of a second substrate comprising electronic components, produced by a certain number of lithography levels, is therefore transferred onto a first substrate also comprising electronic components produced by several lithography levels. The step of bonding the two substrates must therefore be performed by aligning these two substrates with respect to each other so that the patterns (electronic devices, electrical contact areas, etc.) defined on the second substrate are suitably positioned with respect to the patterns defined on the first substrate. However, current alignment performances during such a bonding are limited to a few microns, which excludes the possibility of having recourse to such a parallel integration for making for example local electrical connections in the dense areas of the circuit.

The density of integration of the electronic devices in the integrated circuit that can be achieved with such an approach is therefore limited.

One solution to these problems of alignment consists of producing the integrated circuit by a sequential integration of the various levels of electronic components of the integrated circuit. The various levels of electronic devices are in this case produced one after the other. A first level of transistors is for example obtained conventionally from a first substrate of the bulk or SOI (silicon on insulator) type. A second level of transistors is produced from a layer of semiconductive material that is either transferred onto the first level of transistors (as described in the documents FR 2 896 620 and US 2008/0054359 A1), or obtained by epitaxy (or a recrystallised polycrystalline deposition) effected via openings formed through a dielectric material protecting the first level of transistors (as described in the documents U.S. Pat. No. 4,472,729 or US 2009/0020817 A1).

In the document FR 2 896 620, the integrated circuit comprises a superimposition of PMOS transistors on NMOS transistors obtained by transferring a layer of germanium onto a planarized dielectric material covering the NMOS transistors, which are produced from a silicon substrate. The PMOS transistors are then implemented in the layer of germanium. The capacitive coupling between the two levels of transistors is here dependent on the uniformity of the planarization of the dielectric material. The thickness of the dielectric to be etched during the production of the electrical contacts is approximately twice as great for the lower level as for the upper level. However, this may give rise a degradation of the electrical contact areas of the upper level or insufficiency of etching for the lower level. One solution consists of making the electrical contacts in several steps, which increases the production costs accordingly.

When an integrated circuit is produced by sequential integration, producing the upper level or levels of electronic devices must involve reduced thermal budgets in order not to degrade the lower level or levels of electronic devices.

These various integrations of several levels of transistors also come up against the congestion of the electrical connection levels produced.

DISCLOSURE OF THE INVENTION

Thus there is a need to propose a novel type of method of producing an integrated circuit making it possible to produce a three-dimensional integrated circuit not having the problems of alignment, thermal budgets to be respected and etching of dielectric during the production of the electrical connection levels of the integrated circuit, and which makes it possible to overcome the problems of congestion of the electrical connection levels encountered when the methods of producing an integrated circuit of the prior art are used.

For this purpose, one embodiment of the present invention proposes a method of producing an integrated electronic circuit comprising at least the steps of:

producing a substrate comprising at least a first and second layer of semiconductor between which at least a third layer of material is placed, producing at least a first MOS device, an active area of which is formed in at least part of the first layer of semiconductor, producing at least a second MOS device, an active area of which is formed in at least part of the second layer of semiconductor, the active area of the second MOS device being placed between a gate of the second MOS device and the active area of the first MOS device.

One embodiment of the invention proposes a method of producing an integrated electronic circuit comprising at least the steps of:

producing a substrate comprising at least a first and second layer of semiconductor between which at least a third layer of material is placed, then producing at least a first MOS device, an active area of which is formed in at least part of the first layer of semiconductor, then producing at least a second MOS device, an active area of which is formed in at least part of the second layer of semiconductor, the active area of the second MOS device being placed between a gate of the second MOS device and the active area of the first MOS device.

Thus, at least two levels of MOS devices are produced on each side of a substrate comprising at least two layers of semiconductor serving to produce the active areas (corresponding to the source, the drain and the channel for an MOS transistor) of the MOS devices.

Such a method therefore makes it possible to overcome the problems of alignment encountered during a parallel integration of the various levels of devices, for example when MOS devices are produced independently of one another and then connected electrically to one another, or when a first MOS device is produced in a substrate and then a second MOS device is produced above the first MOS device. In addition, given that the two levels of MOS devices are produced on either side of the substrate, the electrical connections can also be produced on either side of the substrate, which solves the problems relating to the thickness of material to be etched in order to make these electrical connections and the problems related to the congestion of the electrical connection levels.

Finally, although being of a sequential type, this method makes it possible to produce each level of MOS devices with characteristics close to non-three-dimensional integrated circuits in terms of thermal budget.

The distance between the active areas of the two MOS devices, that is to say the coupling between these two MOS devices, is chosen by means of the chosen thickness of the third layer.

The active area of the second MOS device is placed between a gate of the second MOS device and the active area of the first MOS device, these elements being placed along the same axis.

Although the method is described here as producing two MOS devices, the method will advantageously be implemented for producing a first level of MOS devices comprising several first MOS devices and a second level of MOS devices comprising several second MOS devices.

The first and second MOS devices may have complementary conductivity, one being of the NMOS type and the other of the PMOS type.

The materials of the first and second layers of semiconductor may be monocrystalline. Thus the MOS devices may have very good electrical performances and low electrical consumption.

The first layer of semiconductor, the second layer of semiconductor and the third layer of material may be based on monocrystalline semiconductors produced by epitaxy. In such a configuration, the materials of these three layers then have the same crystalline orientation. In addition the thickness of each of these layers is then perfectly controlled, unlike the methods of the prior art comprising steps of deposition and chemical-mechanical planarization that give rise to problems with uniformity, and therefore non-controllable capacitative couplings in the device produced.

In another variant, these three layers may be composed of polycrystalline semiconductive materials. Such a variant can in particular be envisaged for producing transistors of the TFT type (thin film transistors).

The third layer may be composed at least of SiGe or porous silicon.

In a variant, it is possible for the third layer to be composed of a dielectric material, for example silicon dioxide. This third layer may in this case be the result of molecular bonding of two dielectric layers.

When the first MOS device is produced, the first layer of semiconductor and the third layer may be etched according to a same pattern corresponding to the active area of the first MOS device.

When the first MOS device is produced, the first and second layers of semiconductor and the third layer may be etched according to the same pattern corresponding to the active areas of the first and second MOS devices. Thus the first and second transistors comprise auto-aligned active areas.

The method may also comprise, when the second MOS device is produced, implementation of the steps of:

removal of a remaining portion of the third layer etched according to the pattern corresponding to the active area of the first MOS device, deposition of a dielectric material at least between the active areas of the first and second MOS devices.

The third layer serves in this case as sacrificial material that can be etched selectively with respect to a dielectric material forming for example lateral isolations of the MOS devices which surround this sacrificial material.

By removing the remaining portion of the third layer, a cavity is obtained placed between the second channels of the two MOS devices. It is possible to place in this cavity a dielectric material (high K or not), or a floating gate (for example composed of high K dielectric and TiN that may be deposited by CVD), or an ONO (oxide-nitride-oxide) stack thus forming a flash memory and/or make it possible to produce a modulation of the threshold voltages of the MOS devices.

The method may also comprise, when the second MOS device is produced, implementation of the steps of:

removal of a remaining portion of the third layer etched according to the pattern corresponding to the active area of the first MOS device, production, between the active areas of the first and second MOS devices, of a stack comprising a portion of electrically conductive material placed between two portions of dielectric material.

In this way first and second superimposed MOS devices can be produced, comprising an electrode forming a floating gate making it possible to achieve backward control of these two MOS devices. Such a portion of electrically conductive material may also make it possible to locally block the capacitive coupling between the two MOS devices.

The MOS devices may be transistors.

The method may also comprise, when the second MOS device is produced, implementation of the steps of:

removal of a remaining portion of the third layer etched according to the pattern corresponding to the active area of the first MOS device, production, between the active areas of the first and second MOS devices, of a memory stack comprising a portion of material able to effect a retention of electrical charges placed between two portions of dielectric material, the first and second MOS devices being able to form a memory cell.

The memory cell may in this case be of the flash type.

The method may also comprise, between the steps of production of the first and second MOS devices, the steps of:

deposition of a dielectric material covering at least the first MOS device, securing of said dielectric material against a second substrate.

The securing of the dielectric material to the second substrate is advantageously performed after a thermal activation of dopants implanted in the active area of the first transistor.

The method may also comprise, after the production of the second MOS device, the steps of:

deposition of a dielectric material covering the second MOS device, production, at least in the dielectric material covering the second MOS device, of at least a first level of electrical connections and one or more vias electrically connecting the second MOS device to the first electrical connection level, the second MOS device being placed between the first electrical connection level and the first MOS device.

The term "vias" designates vertical electrical connections connecting for example the MOS device with an electrical connection level or two electrical connection levels. One or more first electrical connection levels are produced here, that is to say one or more superimposed electrical connection levels placed above the second transistor.

The method may also comprise, after the production of the first electrical connection level, the steps of:

securing of the dielectric material covering the second MOS device against a third substrate, removal of the second substrate, production, at least in a dielectric material covering the first MOS device, of at least a second electrical connection level and one or more vias electrically connecting the first MOS device to the second electrical connection level, the first MOS device being placed between the second electrical connection level and the second MOS device.

Here one or more second electrical connection levels are produced, that is to say one or more superimposed electrical connection levels placed above the first transistor.

The electrical connection levels electrically connected to the first and second MOS devices are produced after having formed the active areas of the two MOS devices. Thus the thermal budgets involved for producing the two MOS devices are not limited because of the presence of these connections.

It is possible to produce the electrical connection levels electrically connected to the first MOS device before effecting the transfer onto the second substrate. In this case, the thermal budget during the production of the second MOS device is limited, for example less than approximately 500° C.

It is also possible to produce simultaneously the electrical connection levels electrically connected to the first and second MOS devices.

It is also possible to produce some of the electrical connection levels electrically connected to the first MOS device before effecting the transfer onto the first substrate. This part of the electrical connection levels electrically connected to the first MOS device may consist of effecting a siliciding of the areas to be contacted, and then producing electrical contacts connected to the silicided areas. The "metal 1" level is replaced by a deposition of material that can be etched selectively (for example $Si_3N_4$) with respect to the material (for example $SiO_2$) intended to surround the electrical connection levels. When connections of the second level ("metal 2") are made, sufficiently wide vias may be produced in order to eliminate the selectively etchable material and replace it with an electrically conductive material such as copper. Such a configuration may be produced when a single electrical connection level is electrically connected to the first MOS device.

The removal of the second substrate makes it possible to access the first MOS device in order to terminate it, effecting for example a siliciding of the source and drain regions of the first MOS device. Thus these silicided areas do not limit the thermal budgets involved in order to produce the two MOS devices.

The third layer may comprise regions of different thicknesses such that, when the method comprises the production of several MOS devices and several second MOS devices, the distances between the active areas of a first and second MOS device produced one above the other may correspond to the different thicknesses of the third layer. It is thus possible to produce an integrated circuit comprising MOS devices coupled differently from each other. It is in particular possible to modulate the threshold voltages of the various MOS devices according to the applications envisaged. Thus, by reducing the threshold voltages, it is possible to produce an integrated electronic circuit suited to applications requiring little power, or on the contrary by increasing the threshold voltages to produce an integrated electronic circuit suited to applications of higher power.

The third layer, which comprises regions with different thicknesses, may be obtained by implementing several successive steps of epitaxy of the material of the third layer on the second semiconductor layer during which masks are produced on the epitaxially grown layers in order to form the regions with different thicknesses of the third layer.

When the first and/or second MOS device is of the PMOS type, production of the first and/or second PMOS device may comprise the implementation of an epitaxial growth of SiGe on the part of the first and/or second semiconductor layer intended to form the active area of the first and/or second PMOS device.

When the first MOS device is of the PMOS type, production of the first PMOS device comprises the implementation of an epitaxial growth of SiGe on the part of the first semiconductor layer intended to form the active area of the first PMOS device, and/or, when the second MOS device is of the PMOS type, the production of the second PMOS device comprises the implementation of an epitaxial growth of SiGe on the part of the second semiconductor layer intended to form the active area of the second PMOS device.

Thus the active area used for producing the PMOS device may be composed of an Si—SiGe dual layer optimising the mobility of the holes in the PMOS device.

It may be envisaged coupling the integrated circuit obtained with one or more other integrated circuits according to the number of circuit levels desired.

BRIEF DESCRIPTION OF THE DRAWINGS

The present invention will be better understood from a reading of the description of example embodiments given purely indicatively and in no way limitatively with reference to the accompanying drawings, in which:

FIGS. 1 to 14B show the steps of a method of producing an integrated electronic circuit according to a first embodiment.

Identical, similar or equivalent parts of the various figures described below bear the same numerical references so as to facilitate passage from one figure to another.

The various parts shown in the figures are not necessarily shown to a uniform scale, in order to make the figures more legible.

The various possibilities (variants and embodiments) must be understood as not being exclusive of one another and may be combined with one another.

DETAILED DISCLOSURE OF PARTICULAR EMBODIMENTS

Reference is made first of all to FIGS. 1 to 14B which show the steps of a method of producing an integrated circuit 100 according to a first embodiment. Although the production of only two MOS devices 140 and 172, here transistors, distributed over two different levels of the integrated circuit 100, are shown in these figures, the method used makes it possible to produce an integrated circuit 100 comprising a plurality of first MOS devices and a plurality of second MOS devices distributed over two different levels of the integrated circuit 100.

Figure 1:
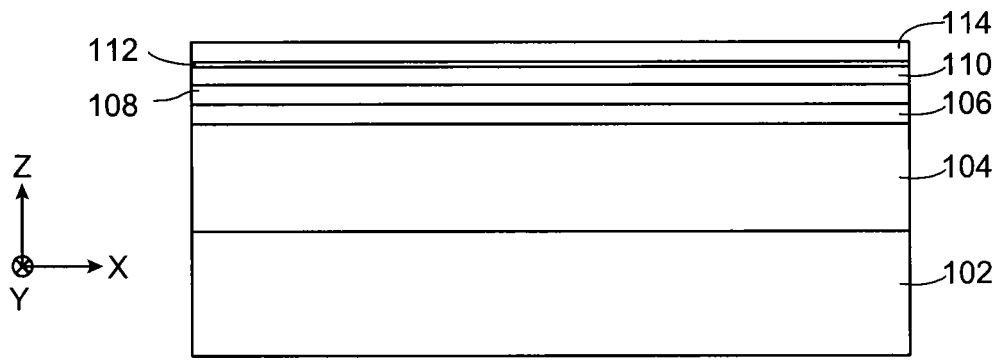

As shown in FIG. 1, the method is implemented using a substrate of the semiconductor on insulator type, for example SOI, comprising a semiconductor support layer 102, for example composed of silicon, on which a buried dielectric layer 104 is placed, for example composed of $SiO_2$, and a surface layer of semiconductor 106, for example a thin layer of silicon with a thickness less than approximately 10 μm, and preferably less than approximately 100 nm. A sacrificial layer 108 composed for example of SiGe is formed, for example by epitaxy, on the surface layer of silicon 106, and then, on the sacrificial layer 108, another layer of semiconductor 110, for example composed of silicon and formed for example by epitaxy. The layer 110 is hereinafter referred to as the first layer of semiconductor and the layer 106 is called the second layer of semiconductor. The sacrificial layer 108 forms a third layer placed between the first and second layers of semiconductor 108, 110.

The sacrificial layer 108 of SiGe has for example a thickness of between approximately 2 nm and 100 nm. In addition, the sacrificial layer 108 may be composed of approximately 10% to 60% germanium, for example 20% germanium. The germanium concentration of the sacrificial layer 108 is chosen in particular according to the required thickness of the first layer of semiconductor 110, which is for example between approximately 2 nm and 100 nm, given that the thickness of silicon that it is possible to grow by epitaxy without relaxation depends in particular on the germanium concentration of the material of the sacrificial layer 108. The document "Chemical vapour etching of Si, SiGe and Ge with HCl; applications to the formation of thin relaxed SiGe buffers and to the revelation of threading dislocations" by Y. Bogumilowicz et al., Semicond. Science & Technology, (20) 2005, pages 127-134, describes in more detail the relationship between the germanium concentration of a layer of SiGe and the thickness of silicon that may be obtained by epitaxy on the layer of SiGe.

The layers 106 and 110 are composed of semiconductor because these two layers serve for the subsequent production of the active areas of the MOS transistors of the integrated circuit 100. The SiGe of the sacrificial layer 108 also has the advantage of being able to be etched selectively with respect to the silicon of the layers of semiconductor 106 and 110. The germanium concentration of the sacrificial layer 108 will also influence the selectivity of etching of the SiGe with respect to the silicon of the layers 106 and 110.

However, it is possible that the layer 106 and/or the layer 110 are also composed of SiGe, or that the layer 108 is composed of a material that cannot be etched selectively with respect to the semiconductive material of the layers 106 and 110. In this case, the elimination of the layer of sacrificial material 108 that will be performed subsequently during the method can be carried out with the aid of a mask or a protection of the layers 106 and 110.

Advantageously, the three layers 106, 108 and 110 are composed of monocrystalline materials. In this way an Si—SiGe—Si monocrystalline stack is obtained.

In a variant embodiment, the sacrificial layer 108 may be composed of porous silicon.

A layer of oxide 112, for example composed of $SiO_2$ and with a thickness of between approximately 5 nm and 30 nm, is formed for example by deposition on the first layer of semiconductor 110. A layer of nitride 114, for example composed of silicon nitride, and with a thickness of between approximately 10 nm and 50 nm, is formed for example by deposition on the layer of oxide 112.

Figure 2A:
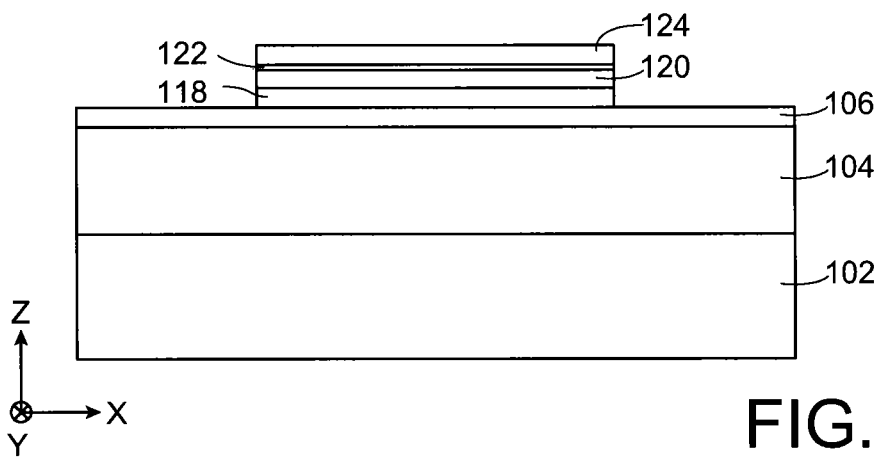
Figure 2B:
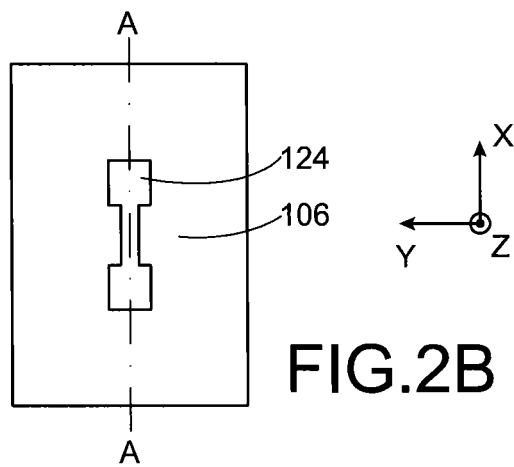

As shown in FIGS. 2A and 2B (FIG. 2A showing a view in section along the axis AA shown in FIG. 2B; FIG. 2B showing a plan view), steps of photolithography and etching of the layers 108, 110, 112 and 114 according to a pattern defining an active area of a first MOS transistor 140 are performed, this active area being intended to be produced using a portion of silicon 120 corresponding to a remaining portion of the first layer of semiconductor 110. The etching is stopped on the second layer of semiconductor 106. The pattern formed by the remaining portions 118, 120, 122 and 124 of the layers 108, 110, 112 and 114 correspond to the future source, drain and channel regions of the first MOS transistor 140.

Figure 3:
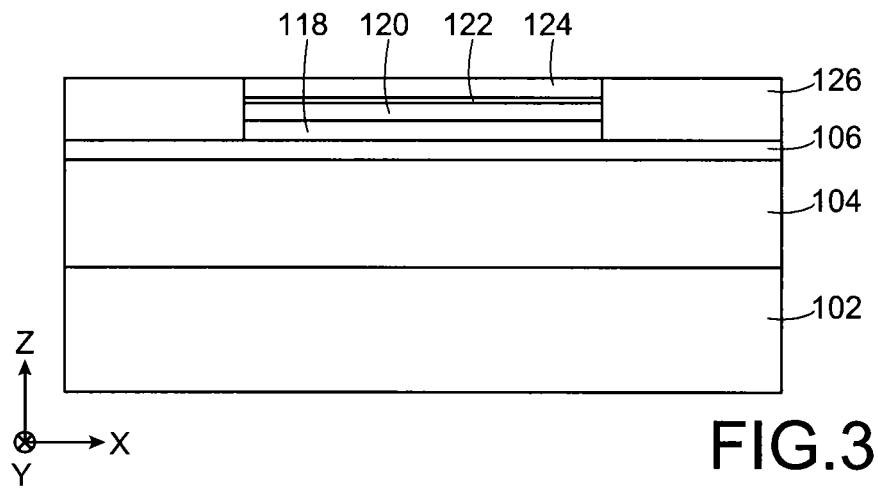

A dielectric material, for example $SiO_2$, is then placed around the remaining portions 118, 120, 122 and 124, forming dielectric portions 126 laterally isolating (corresponding to STI, or "Shallow Trench Isolation") the future active area of the first MOS transistor (FIG. 3). These dielectric portions 126 are for example obtained by implementing a deposition of oxide covering the stack of remaining portions 118, 120, 122 and 124 as well as the second layer of semiconductor 106, and then a chemical-mechanical planarization of this oxide with stopping on the remaining portion of nitride 124. Apart from their role of lateral electrical isolation, these dielectric portions 126 also protect the second layer of semiconductor 106, in particular during steps of gate etching that will be implemented subsequently. The dielectric portions 126 may have a thickness, corresponding to the sum of the thicknesses of the layers 108, 110, 112 and 114, of between approximately 20 nm and 100 nm.

Figure 4:
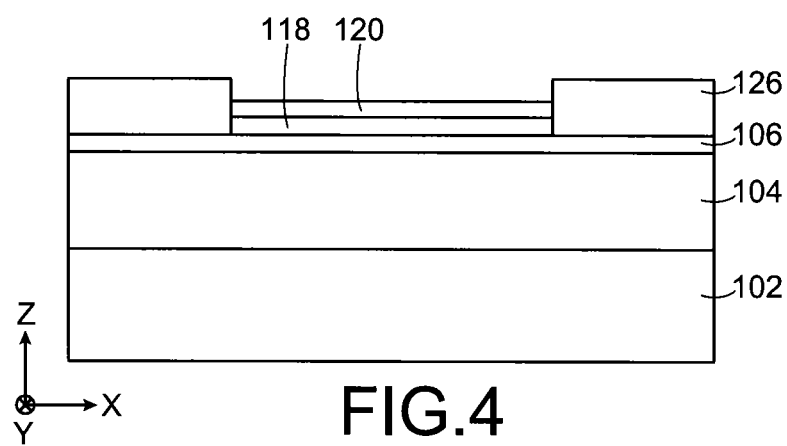

As shown in FIG. 4, the remaining portions 122 and 124 of oxide and nitride are eliminated, revealing the remaining portion 120 of silicon intended to form the active area of the first MOS transistor 140.

Figure 5A:
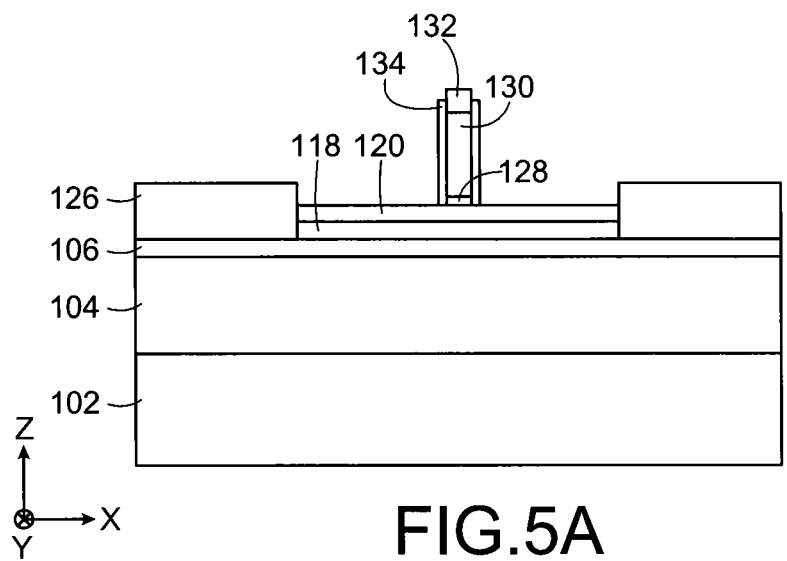
Figure 5B:
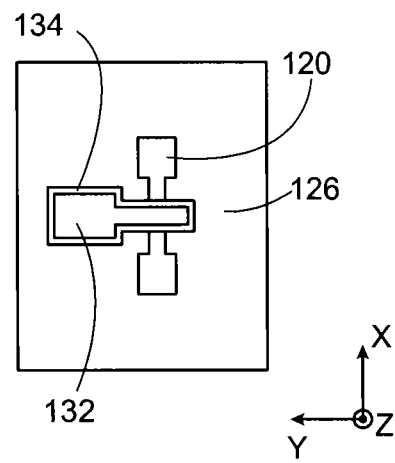

As shown in FIGS. 5A and 5B, a gate of the first MOS transistor 140 is produced. First of all a gate dielectric 128 is deposited (for example $SiO_2$, $HfO_2$, HfSiON, etc.) then a gate material 130 (for example polysilicon) and finally a hard mask 132, these materials then being formed by lithography and etching according to the gate pattern required. A gate spacer 134 is then produced around the gate previously produced, the silicon of the portion 120 serving as an etching stop layer when the gate spacer 134 is produced. Dopants are then implanted in the parts of the remaining portion of silicon 120 not covered by the gate in order to form the LDD (Light Doped Drain) and LDS (Light Doped Source) areas of the first MOS transistor 140.

The dopants are n or p type according to the type of the first MOS transistor 140 (for example PMOS).

Figure 6:
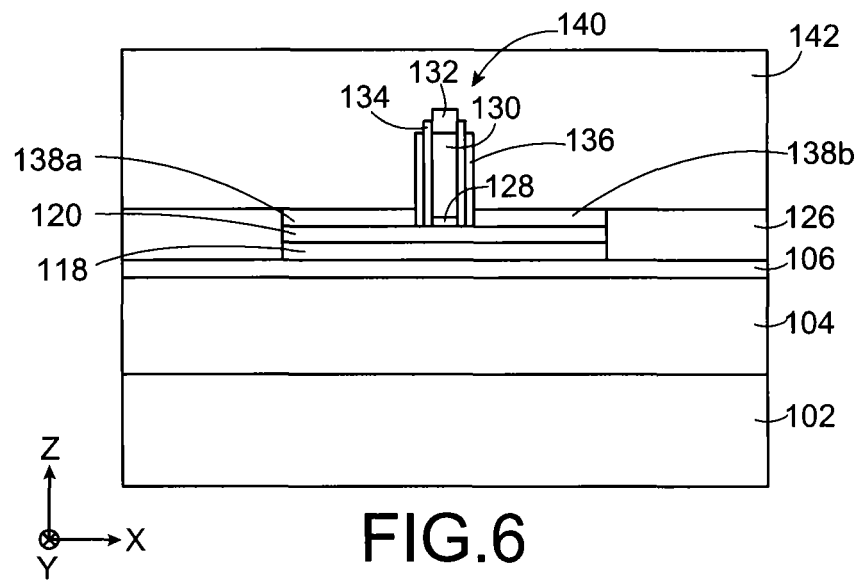

As shown in FIG. 6, a second gate spacer 136 is produced around the first spacer 134. There also, the silicon of the portion 120 serves as an etching stop layer when the second gate spacer 136 is produced. In a variant, it is possible for a single gate spacer to be produced around the gate.

The source 138*a* and drain 138*b* regions of the first MOS transistor 140 are then produced, for example by epitaxy of silicon and doped in situ or by implantation of dopants in the parts of the portion 120 not covered by the gate. Annealing activating the dopants of the source 138*a* and drain 138*b* regions is then performed. It is possible for this dopant activation annealing to be performed only subsequently, after the production of the two transistors, in order to activate the dopants of the two MOS transistors in a single step.

A siliciding of the source 138*a* and drain 138*b* will be preferably be performed subsequently, after having produced the second MOS transistor 172, in order not to limit the thermal budget of the steps implemented in order to produce the second MOS transistor 172.

The assembly previously produced (first MOS transistor 140+dielectric portions 126) is then covered with a dielectric material 142, for example oxides such as $SiO_2$, which is deposited and then planarized, for example using CMP (chemical-mechanical planarization). It is also possible for the assembly previously produced to be covered with several dielectric materials (for example semiconductor oxide and/or nitride) optionally integrating an etching stop layer that will be used to stop subsequent etching when the electrical contacts are produced.

Figure 7:
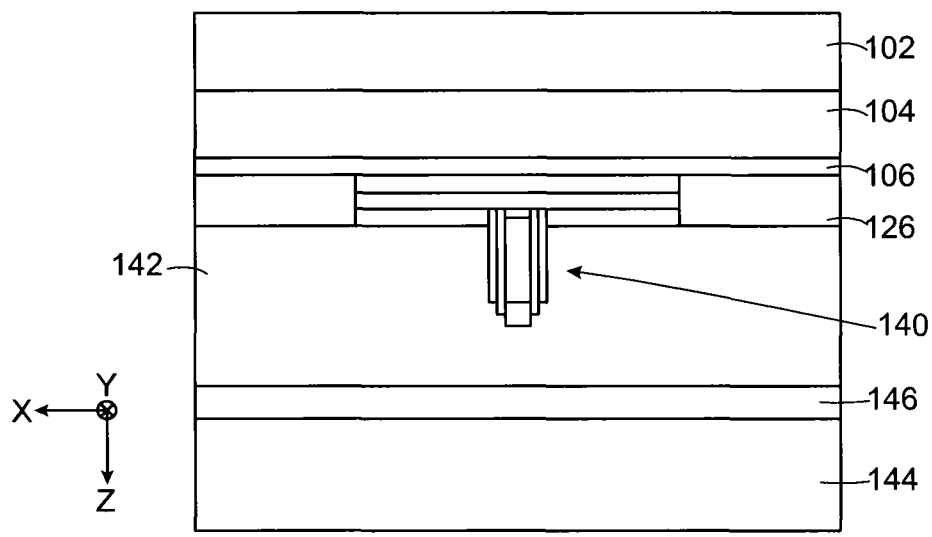

The assembly obtained is then turned over and the dielectric material 142 is secured to a second substrate 144 composed of silicon and comprising on one face, on the dielectric material 142 side, a layer of oxide 146 composed for example of $SiO_2$. Bonding is then implemented between the dielectric material 142 and the oxide layer 146 (FIG. 7). Prior to this securing, it is possible to produce marks for aligning the lithographies implemented subsequently, as described in the document FR 2 848 725.

The silicon support layer 102 and the buried dielectric layer 104 are eliminated for example by partial mechanical abrasion (eliminating the major part of the support layer 102), then by chemical etching of the silicon selective vis-à-vis the dielectric of the layer 104 (for example using a TMAH solution) and finally by chemical etching of the buried dielectric layer 104 with stoppage on the second layer of semi-conductor 106.

Figure 8:
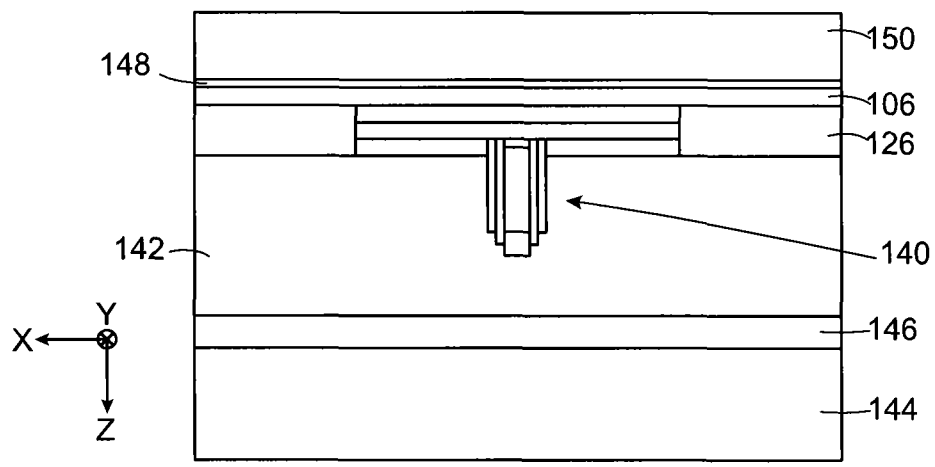

As shown in FIG. 8, the second layer of semi-conductor 106 is covered with a layer of oxide 148 and a layer of nitride 150, for example similar to the layers 112 and 114.

The layers 106, 148 and 150 are then etched according to a pattern corresponding to that of the active area of the second MOS transistor 172. This etching is stopped on the remaining portion of SiGe 118 and on the dielectric portions 126. Remaining portions 152, 154 and 156 of these layers are obtained, the pattern of which corresponds to that of the active area of the second MOS transistor 172 (see FIG. 9A).

FIGS. 9B to 9G show different examples of the pattern of the portion 156, which corresponds to the pattern of the active area of the second MOS transistor 172.

The pattern of the portion of SiGe 118 shown in these figures corresponds to the pattern of the active area of the first MOS transistor 140. In the first example shown in FIG. 9B, the active areas of the two MOS transistors have substantially similar dimensions. Given that the remaining portion of SiGe 118 is intended to be etched, the pattern of the remaining portions 152, 154 and 156 may be such that at least part of the remaining portion of SiGe 118 is accessible by isotropic etching. In the example in FIG. 9B, the remaining portion of SiGe 118 is made accessible to the etching by forming the active area of the second MOS transistor 172 oriented (the orientation corresponding for example to the alignment axis of the source, channel and drain) with a rotation of 90° with respect to the active area of the first MOS transistor 140.

Figure 9A:
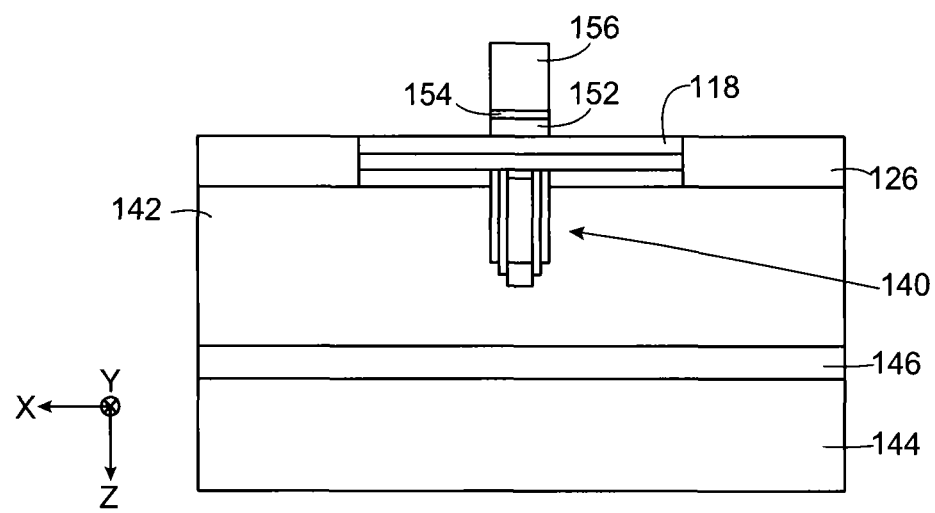
Figure 9B:
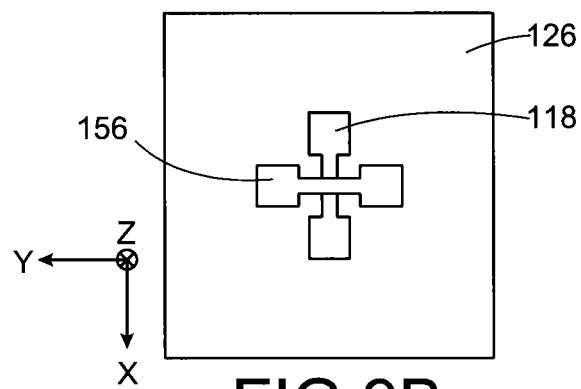
Figure 9C:
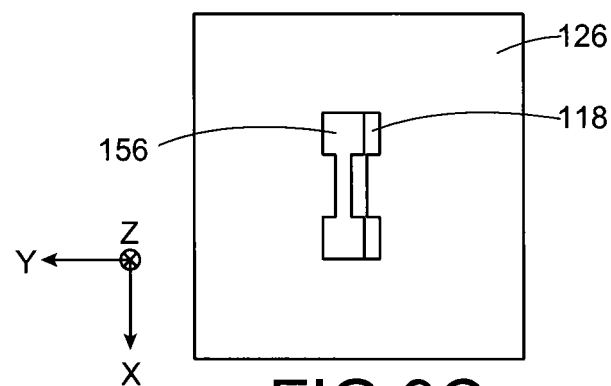
Figure 9D:
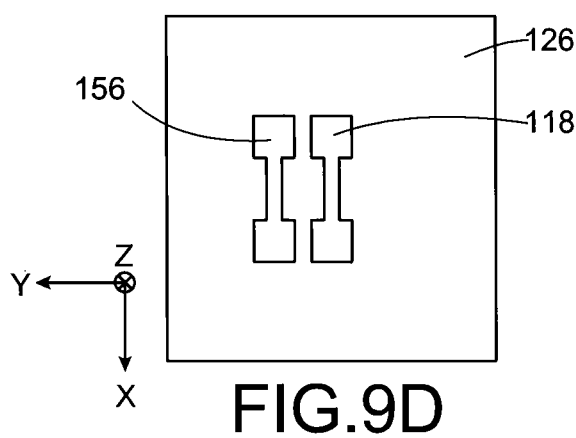

In the examples in FIGS. 9C and 9D, the active areas of the two transistors have substantially similar dimensions and are oriented in the same direction. The accessibility to etching of the portion of SiGe 118 is obtained by a partial offset (FIG. 9C, the active areas partially overlapping) or complete offset (FIG. 9D, the active areas not overlapping) of the two active areas with respect to each other.

Figure 9E:
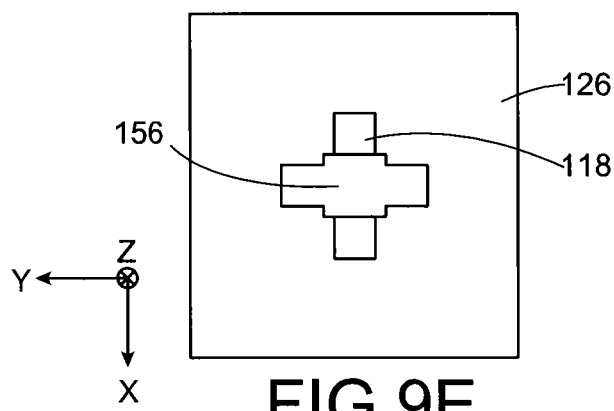
Figure 9F:
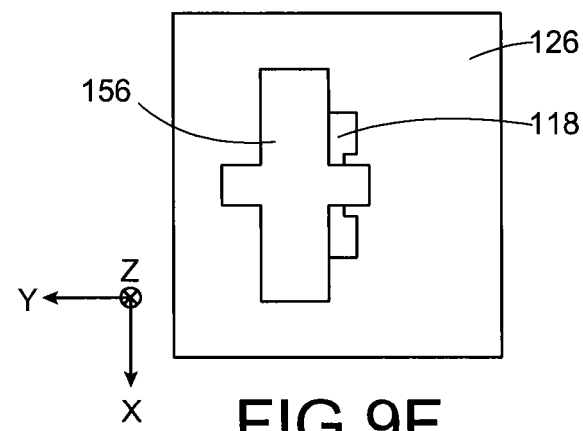
Figure 9G:
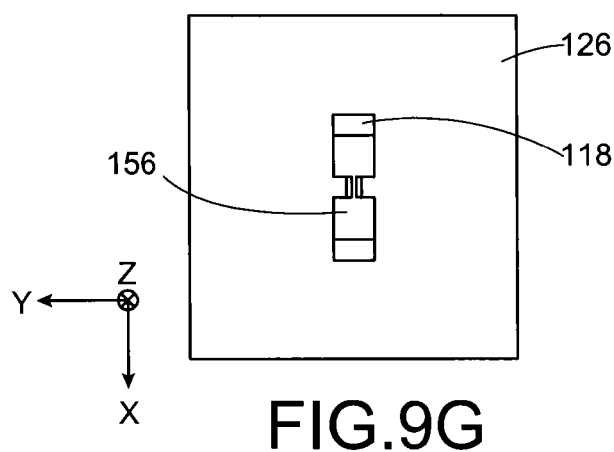

In the example in FIG. 9E, the dimensions of the active area, and in particular the width of the channel, of the second MOS transistor 172 are greater than those of the active area of the first MOS transistor 140. As in the previous example in FIG. 9B, accessibility to the etching of the portion of SiGe 118 is obtained by a rotation of 90° of the active areas of the two transistors with respect to each other. When the dimensions of the active area of the second MOS transistor 172 are very much greater than those of the active area of the first MOS transistor 140 (see FIG. 9F), it is possible, in addition to the rotation through 90°, also to offset the active areas of the two transistors with respect to each other.

When the dimensions of the active area (channel width) of the second MOS transistor 172 are less than those of the active area of the first MOS transistor 140, it is possible not to offset or establish rotation of the active areas of the two transistors with respect to each other since in this case the portion of SiGe 118 is not completely covered by the remaining portions 152, 154 and 156.

It is considered hereinafter that the configuration shown in FIGS. 9A and 9B (active areas with similar dimensions and oriented perpendicular to each other) is implemented. As shown in FIG. 10, the remaining portion of SiGe 118 is eliminated, revealing the portion of silicon 120 forming the active area of the first MOS transistor 140.

A deposition of a dielectric material 158 is then effected, for example composed of silicon oxide, silicon nitride or $HfO_2$, and obtained by a CVD deposition, in the space previously occupied by the remaining portion of SiGe 118, but also around the remaining portions 152, 154 and 156, and therefore around the future active area of the second MOS transistor 172, also covering the dielectric portions 126. This dielectric material 158 is then planarized with stopping on the remaining portion of nitride 156 (FIG. 11). The dielectric material 158 therefore forms lateral isolations of the STI type around the active area of the future second transistor, and electrically isolates the active areas of the two transistors from each other.

The dielectric material 158 is advantageously of such a nature as to generate a force in the channels of the two MOS transistors in order to optimize the mobility of the carriers in these channels. Such a dielectric material 158 is for example tensile SiN (under tension) in the case of PMOS transistors or SiN under compression in the case of MOS transistors (the case of stacks of MOS devices with the same conductivity).

The remaining portions of oxide 154 and nitride 156 are then eliminated, revealing the portion of silicon 152 intended to form the active area of the second MOS transistor 172.

The gate of the second MOS transistor 172 is then formed. For this purpose a gate dielectric 160 (for example SiO₂, HfO₂, HfSiON, etc.), a gate material 162 (for example polysilicon) and a hard mask 164 are deposited. These materials are then formed by lithography and etching according to the required gate pattern. A first gate spacer 166 is then formed around the gate previously produced. A first epitaxy doped in situ at the source and drain regions is implemented, forming regions of LDS 167a and LDD 167b. The dopants are n or p type according to the type of the second MOS transistor 172 (for example NMOS).

Figure 12A:
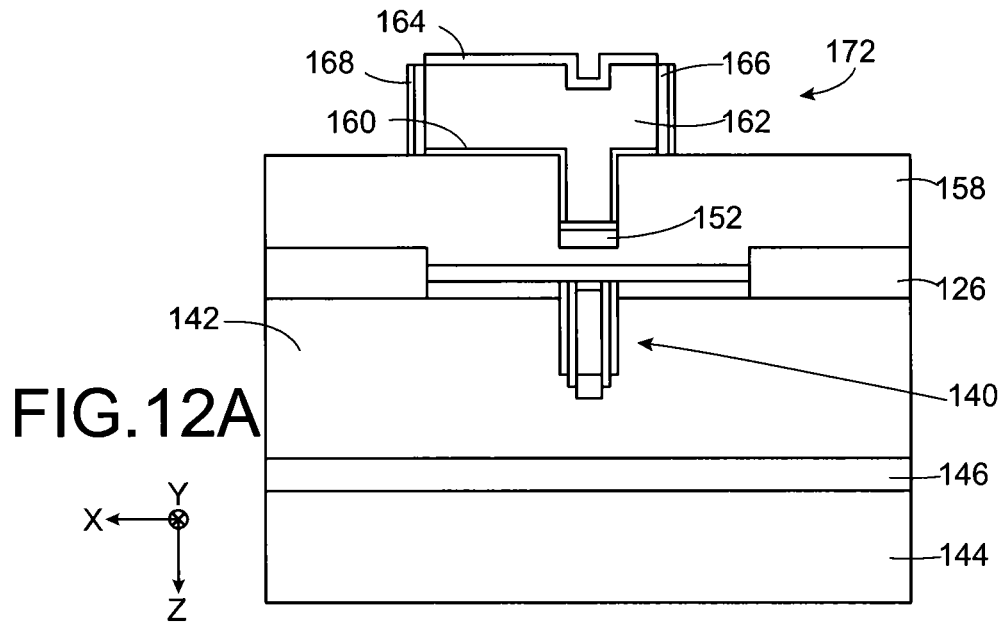
Figure 12B:
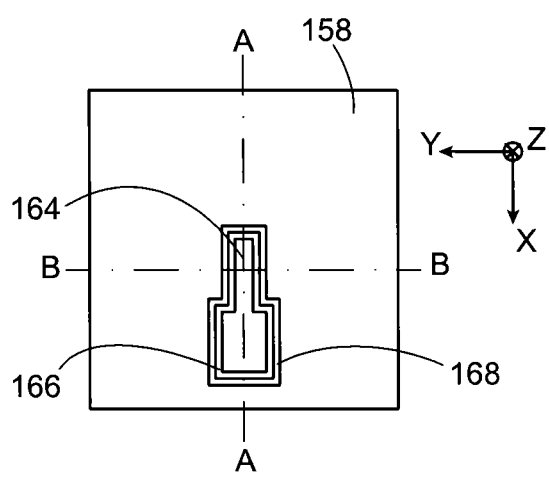
Figure 12C:
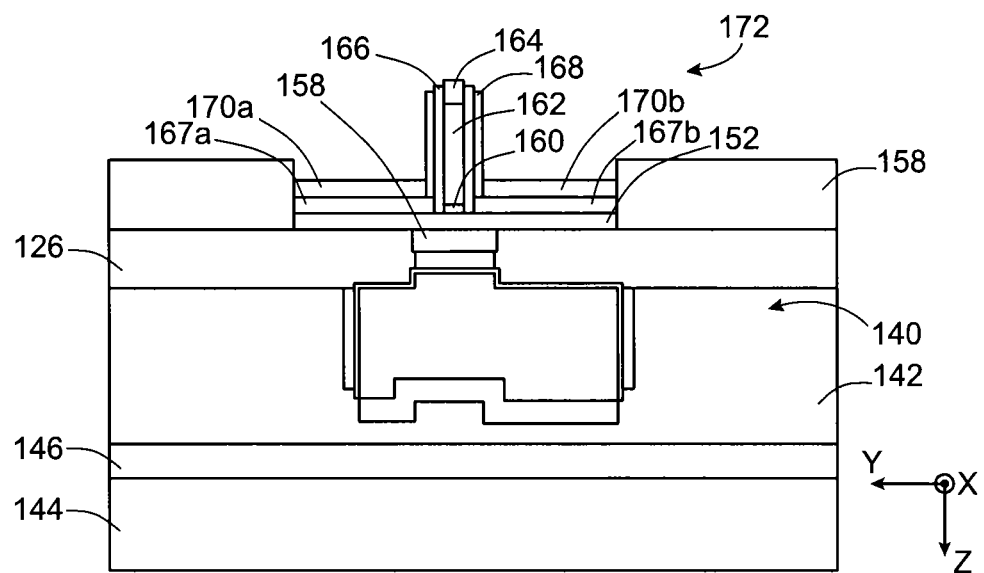

A second gate spacer 168 is produced around the first spacer 166. Another silicon epitaxy is then performed at the source 170a and drain 170b regions of the second MOS transistor 172. Annealing activating the dopants situated in the source 170a and drain 170b regions of the second MOS transistor 172 (and which may possibly activate the dopants of the first MOS transistor 140) is then performed. Finally, a siliciding of the source 170a and drain 170b regions is then performed. This siliciding, for example based on NiSi, NiPtSi, NiSi—SiGe or NiPtSi—SiGe, reduces the access resistances to the source 170a and drain 170b regions. In this way the second MOS transistor 172 is obtained (see FIGS. 12A, 12B and 12C, FIGS. 12A and 12C showing respectively views in section along the axes AA and BB shown in FIG. 12B).

When two MOS transistors 140, 172 are intended to have active areas electrically connected to each other (for example in the case of an inverter), it is possible to etch some of the dielectric material 158 separating the active areas of the two transistors so that, when siliciding metal is deposited, this metal is also deposited in the etched space and effects an electrical contact between the two active areas, for example between the drain of one of the two transistors and the source of the other one of the two transistors.

Figure 13A:
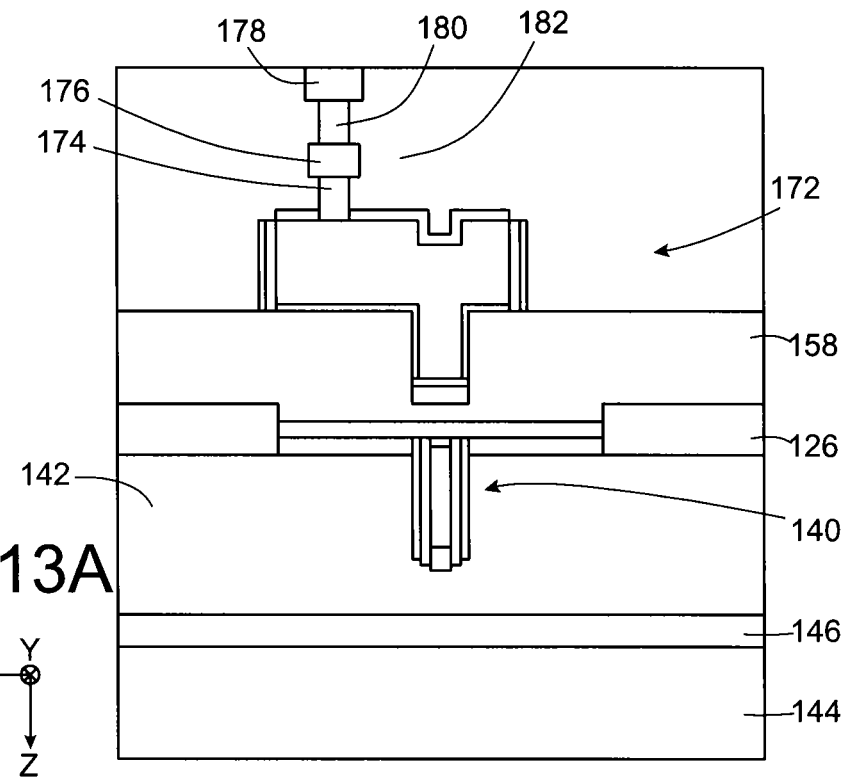
Figure 13B:
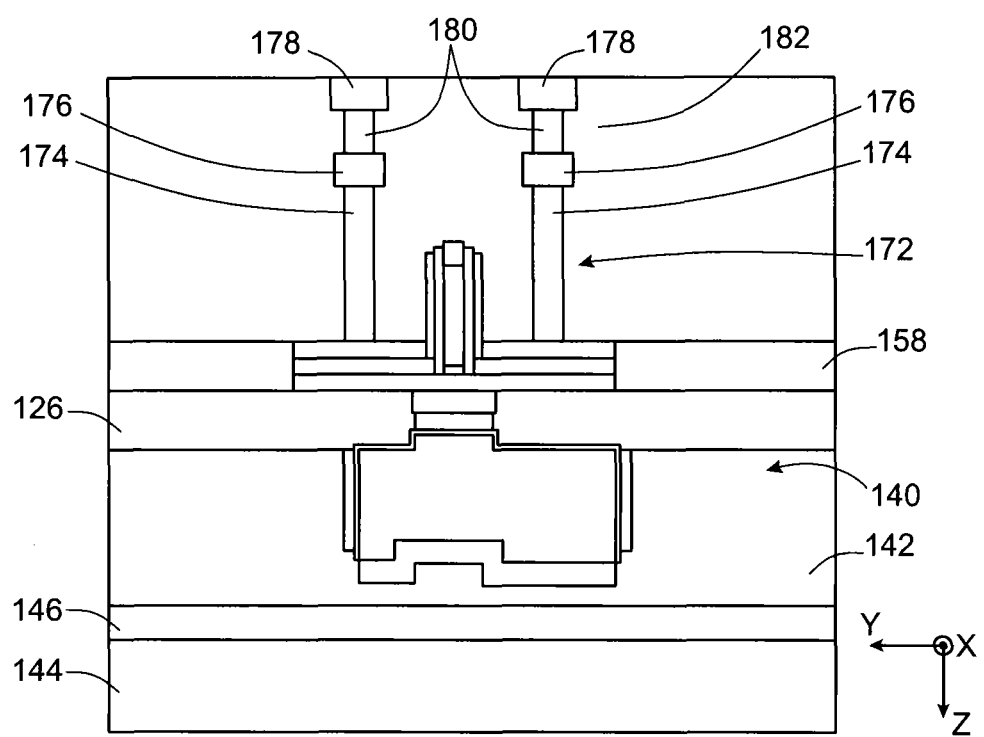

Electrical connections connected to the second MOS transistor 172 are then made. These connections are formed by contacts 174, for example composed of tungsten and electrically connected to the source and drain regions as well as to the gate of the second MOS transistor 172. First electrical connection levels 176 and 178, for example composed of copper, are then produced and electrically connected to the contacts 174, these levels being connected together by vias 180. These electrical connection elements are produced from a dielectric material 182 covering the whole of the second level of transistors 172 (FIGS. 13A and 13B).

Figure 14A:
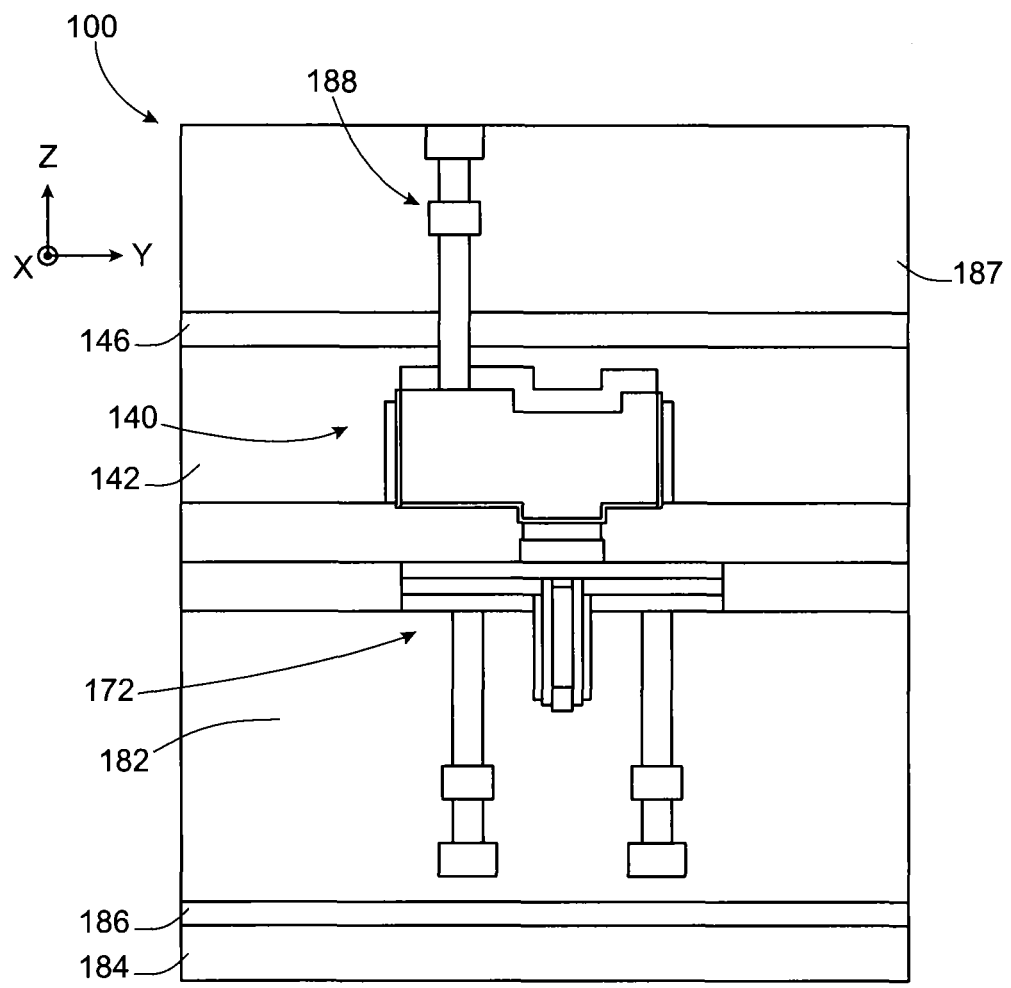
Figure 14B:
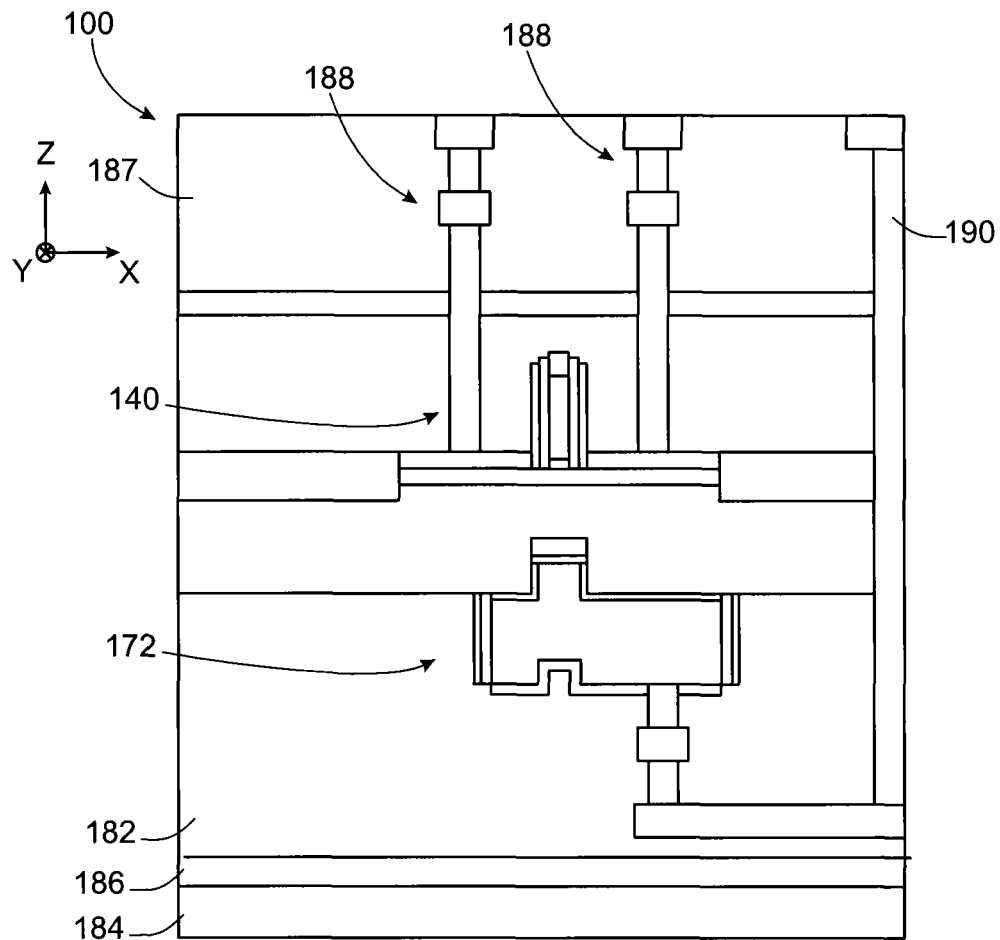

As shown in FIGS. 14A and 14B, the assembly comprising the two transistors 140 and 172 is then transferred onto a third silicon substrate 184 of the bulk type and comprising on one face a layer of oxide 186 composed for example of SiO₂ serving as a bonding interface with the dielectric material 182. The second substrate 144 is then eliminated. A dielectric material 187 is then formed, for example by a deposition of oxide, on the layer of oxide 146. Electrical contact holes are produced through the dielectric material 187. These contact holes form accesses to the source and drain regions of the transistors 140 of the first level. Then a siliciding of these regions is effected through the contact holes. In a variant, it is possible to deposit, before securing to the second substrate 114, a nitride and a bonding oxide layer that is then planarized before being secured to the second substrate 144. After the transfer onto the third substrate 184, the bonding oxide is eliminated, for example by isotropic etching (HF) with stopping on the nitride. The nitride is then removed by dry etching selective with respect to the silicon. It is then possible to perform the siliciding of the source and drain regions of the transistors 140 of the first level.

Second electrical connection levels 188 electrically connected to the source and drain regions and to the gate of the first MOS transistor 140 are then produced in a similar manner to the first electrical connection levels previously implemented and electrically connected to the second MOS transistor 172.

Electrical connections 190 are also made such that they electrically connect electrical connection levels of the transistors of the first and second levels.

In the first embodiment described in relation to FIGS. 1 to 14B, the sacrificial layer 108 composed of SiGe has a substantially constant thickness. Thus, from the stack of layers 106, 108 and 110, the active areas of the first MOS transistors are spaced at a constant distance vis-à-vis the active areas of the second MOS transistors. In a second embodiment, it is possible to produce the sacrificial layer 108 so that it comprises areas of different thicknesses. It is therefore possible to modulate the distance separating the active areas of a first and second MOS transistor produced one facing the other, and therefore to effect a modulation of the capacitative coupling between these two transistors.

Figure 15A:
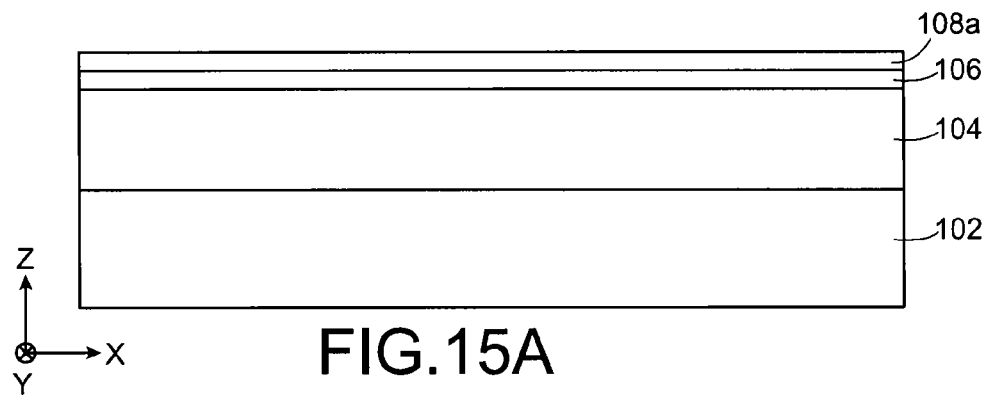
FIGS. 15A to 15G show some of the steps of a method of producing an integrated electronic circuit according to a second embodiment.

For this purpose, as shown in FIG. 15A, a first epitaxy of SiGe, forming a first part 108a of the sacrificial layer 108, the thickness of which is for example between approximately 5 nm and 30 nm, is performed, from the SOI substrate comprising the silicon support layer 102, the dielectric layer 104 and the second layer of silicon 106.

Figure 15B:
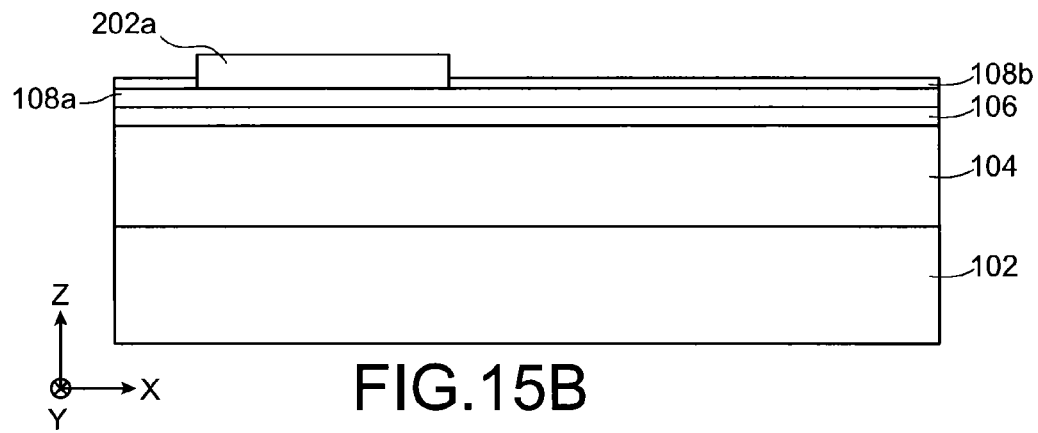

A first mask 202a, the pattern of which delimits the parts of the substrate at which it is wished for the sacrificial layer 108 to have a thickness equal to that of the first part 108a, is produced on the first part 108a of the sacrificial layer. A second epitaxy 108b of SiGe is then performed, forming a second part 108b of the sacrificial layer 108 around the first mask 202a, the thickness of which is for example between approximately 5 nm and 30 nm (see FIG. 15B).

Figure 15C:
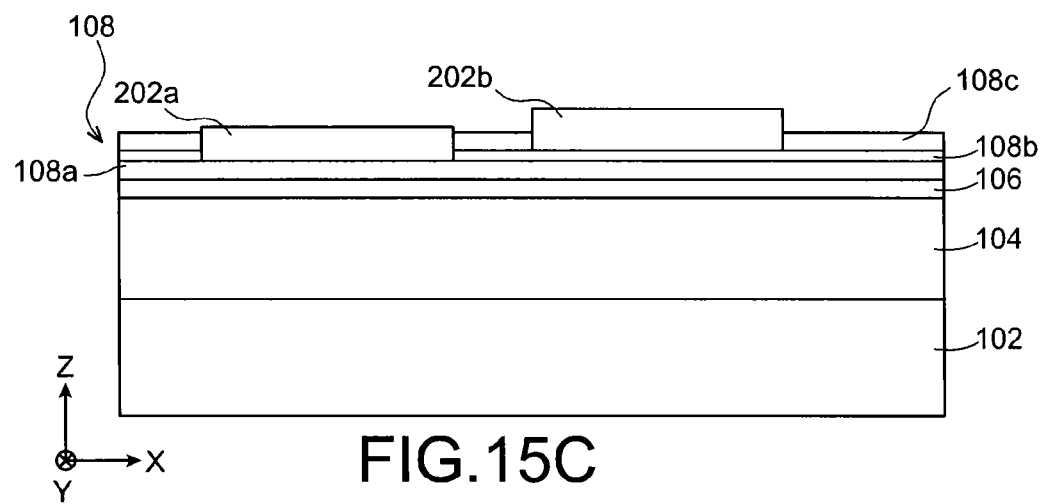

A second mask 202b, the pattern of which delimits the parts of the substrate at which it is wished for the sacrificial layer 108 to have a thickness equal to the sum of the thicknesses of the first part 108a and second part 108b is produced on the second part 108b of the sacrificial layer. A third epitaxy 108c of SiGe is then implemented, forming a third part 108c of the sacrificial layer 108 around the first mask 202a and the second mask 202b, the thickness of which is for example between approximately 5 nm and 30 nm (see FIG. 15C).

When the layers 108a, 108b and 108c are composed of SiGe 30%, the total thickness of these layers may be less than or equal to approximately 100 nm in order to avoid defects related to the relaxation of these layers.

Figure 15D:
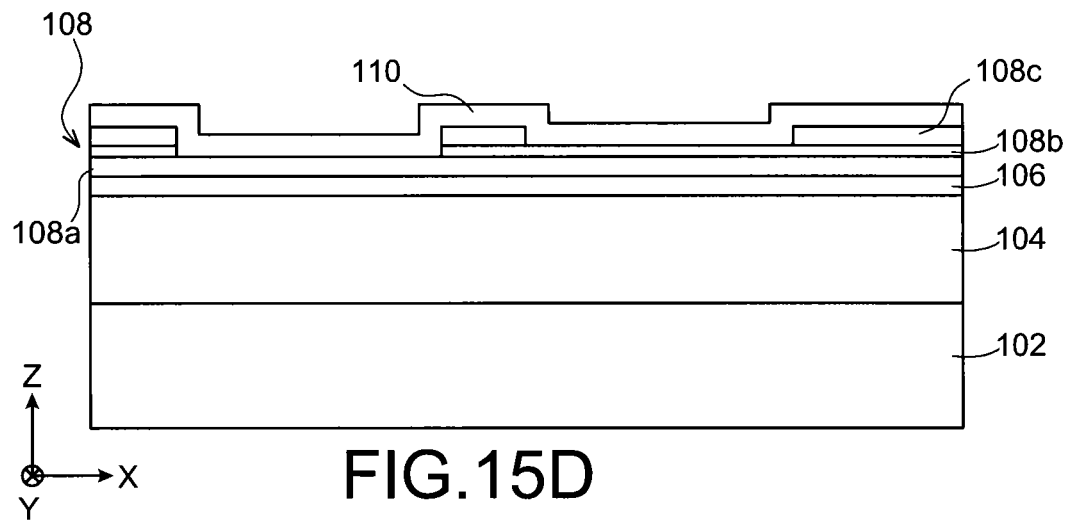

As shown in FIG. 15D, the masks 202a, 202b are then removed and then the first layer of semiconductor 110 is deposited in a conforming manner, for example by silicon epitaxy, on the sacrificial layer 108 of variable thickness, thus matching the various thicknesses of the sacrificial layer 108.

In the example described here, the sacrificial layer 108 comprises three different thicknesses. In general terms, the number of different thicknesses of the sacrificial layer 108 may be different from three and correspond to the number of different modulations that it is wished to produce between the first MOS devices and the second MOS devices.

Figure 15E:
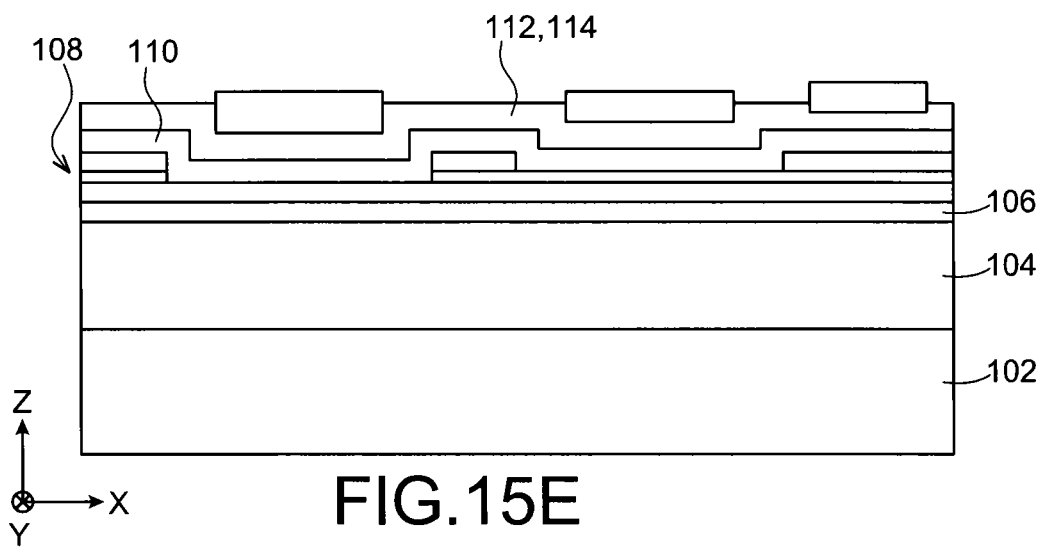

As shown in FIG. 15E, the layers of oxide 112 and nitride 114 are then produced on the first layer of semiconductor 110. The layers 112 and 114 have a variable thickness so that they form a flat top face. Steps of photolithography and etching of the layers 108, 110, 112 and 114 according to a pattern defining active areas of the first MOS transistors are performed. The etching is stopped on the second layer of semiconductor 106.

Figure 15F:
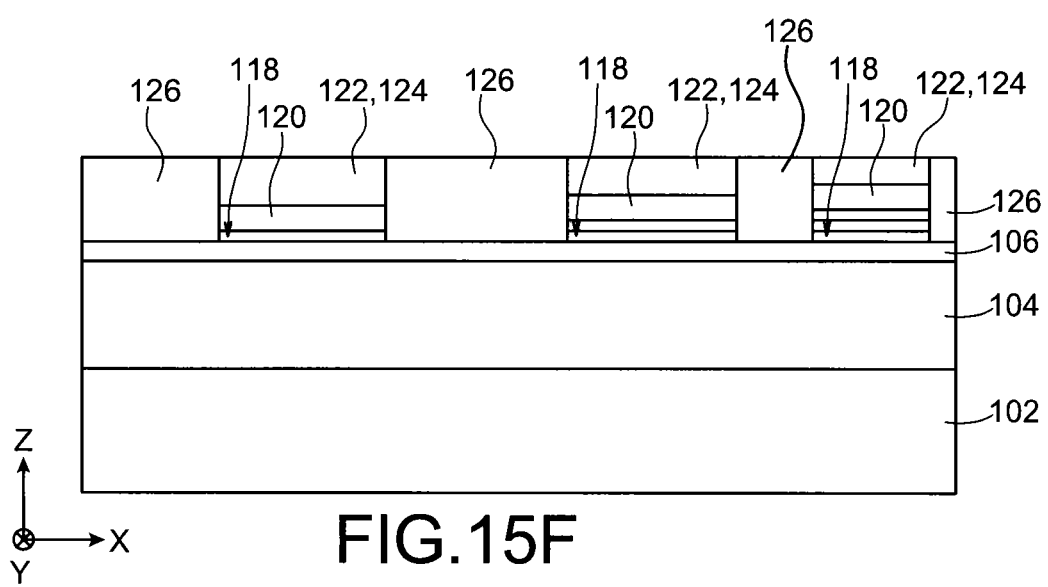

A dielectric material is then deposited around remaining portions 118, 120, 122 and 124, forming the dielectric portions 126 laterally isolating (STI) the future active areas of the first MOS transistors (FIG. 15F). These lateral isolations 126 are for example produced as in the first embodiment.

Figure 15G:
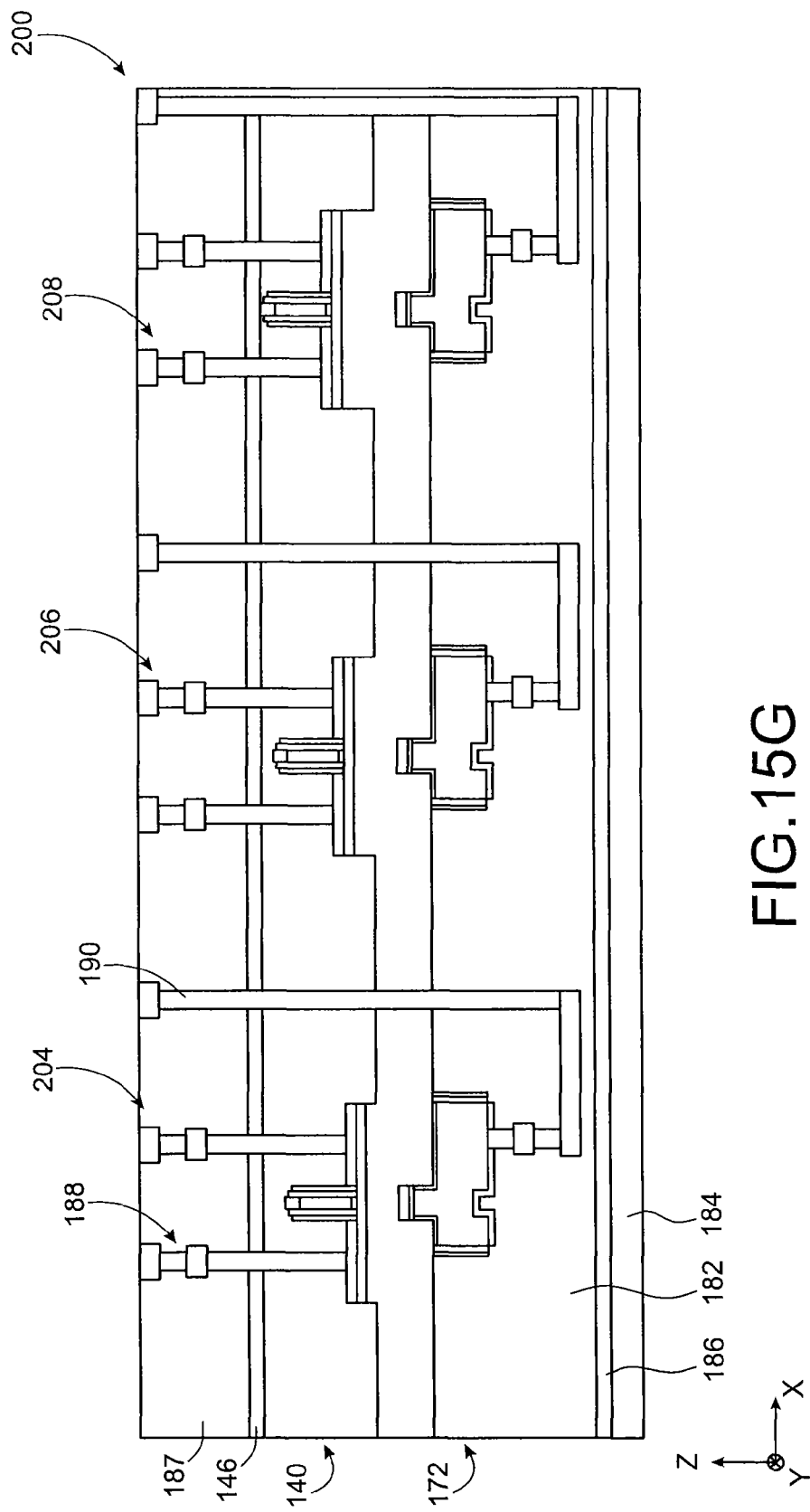

The integrated circuit 200 is then completed in a similar manner to the integrated circuit 100 previously described. As shown in FIG. 15G, the integrated circuit 200 comprises a part 204 in which the first MOS transistor 140 has a high capacitive coupling with the second MOS transistor 172 (transistors produced at a portion 118 of the sacrificial layer 108 of thickness equal to that of the first part 108*a*), making it possible to modulate the threshold voltages of one with respect to the other. The integrated circuit 200 also comprises a part 206 in which the first MOS transistor 140 has a moderate capacitative coupling with the second MOS transistor 172 (transistors produced at a portion 118 of the sacrificial layer 108 of thickness equal to that of the sum of the first part 108*a* and second part 108*b*), and a part 208 in which the first MOS transistor 140 has a low capacitive coupling with the second MOS transistor 172 (transistors produced at a portion of 118 of the sacrificial layer 108 of thickness equal to the sum of the first part 108*a*, the second part 108*b* and the third part 108*c*).

The production of a three-dimensional integrated circuit 300 according to a third embodiment is now described in relation to FIGS. 16A to 16D.

The steps previously described in relation to FIGS. 1 to 4 are first performed, forming the future active areas of the first MOS transistors delimited by the dielectric portions 126.

Figure 16A:
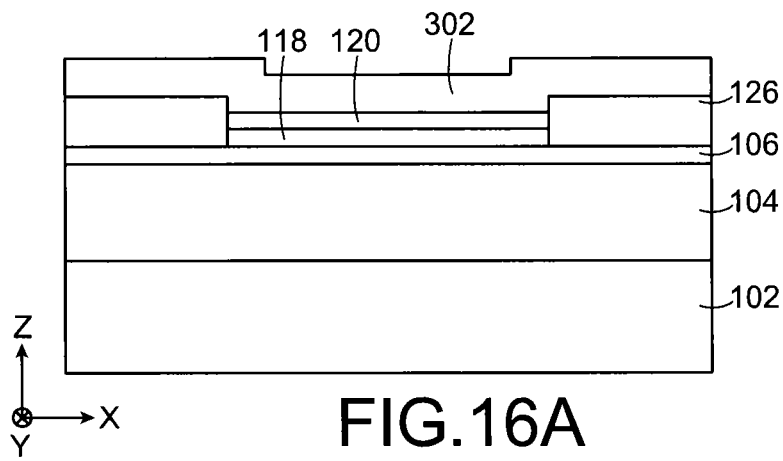
FIGS. 16A to 16D show some of the steps of a method of producing an integrated electronic circuit according to a third embodiment.
Figure 16B:
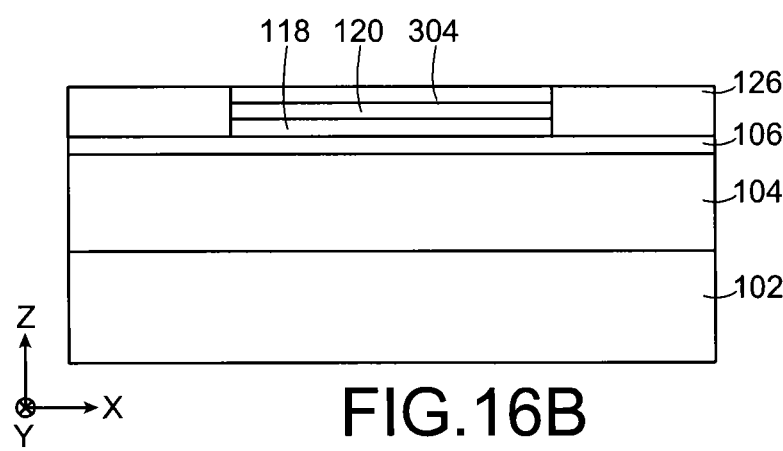

The future active areas of the first transistors of the NMOS type are then masked by effecting a deposition of nitride 302, a photolithography and an etching of the nitride 302 (FIG. 16A). An epitaxy of SiGe 304 is then effected on the non-masked portions of silicon 120, which therefore correspond to the future active areas of the first PMOS transistors (see FIG. 16B).

Figure 16C:
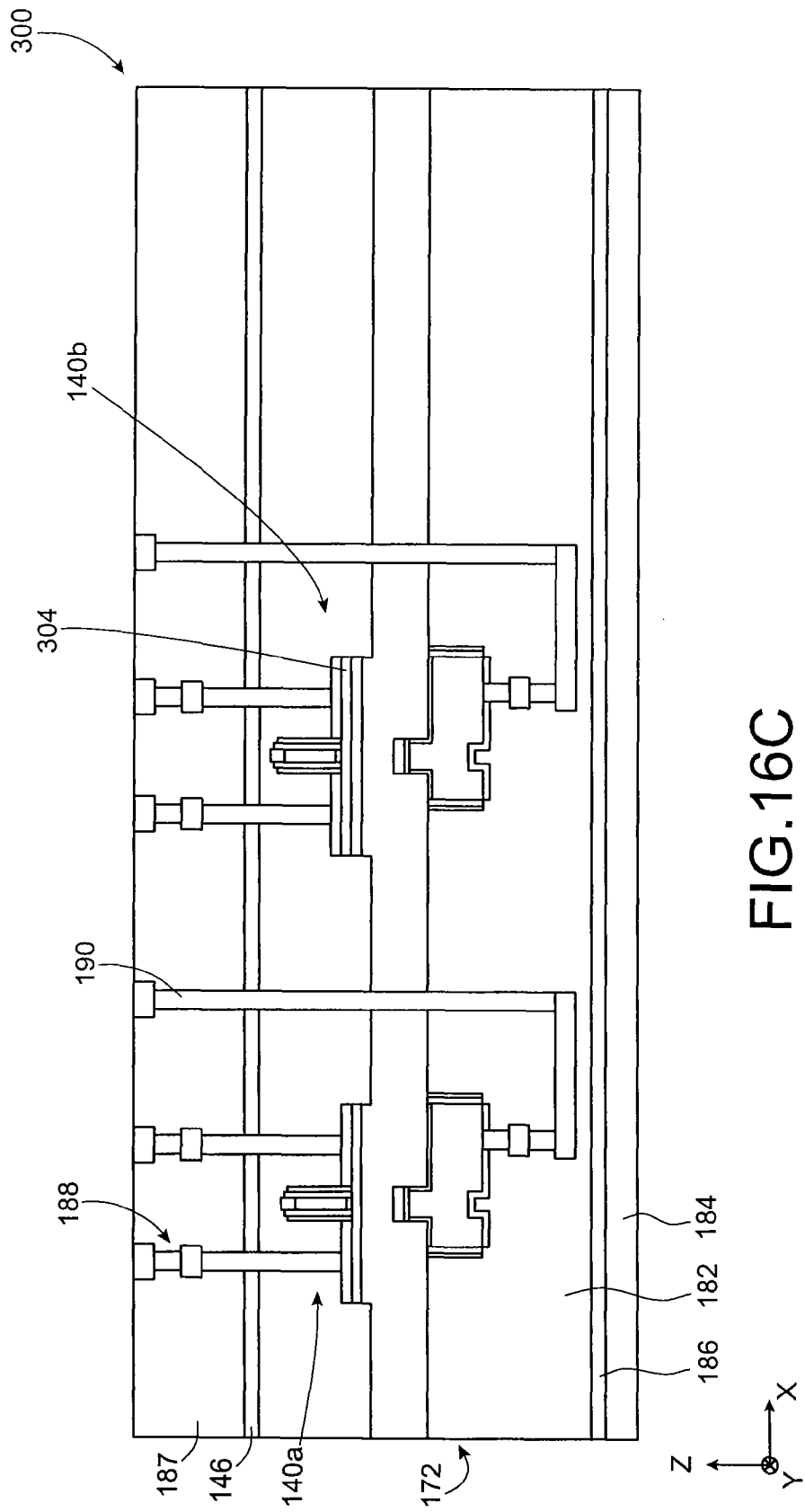

The integrated circuit 300 is computed in a similar manner to the first embodiment. As shown in FIG. 16C, the integrated circuit 300 obtained comprises first MOS transistors, and in particular first NMOS transistors 140*a* the active areas of which are composed of the semiconductor of the portions 120 and first PMOS transistors 140*b* the active areas of which are composed of the semiconductor of the portions 120 and SiGe 304 obtained by epitaxy on the semiconductor of the portions 120.

In a variant, it is possible to produce the first MOS transistors so that those of the PMOS type comprise active areas composed solely of the semiconductor of the portions 120 and those of the NMOS type comprise active areas composed of the semiconductor of the portions 120 and the SiGe 304 obtained by epitaxy on the semiconductor of the portions 120. In another variant, it is possible for the epitaxy of SiGe to be effected both for the first NMOS and first PMOS transistors.

Figure 16D:
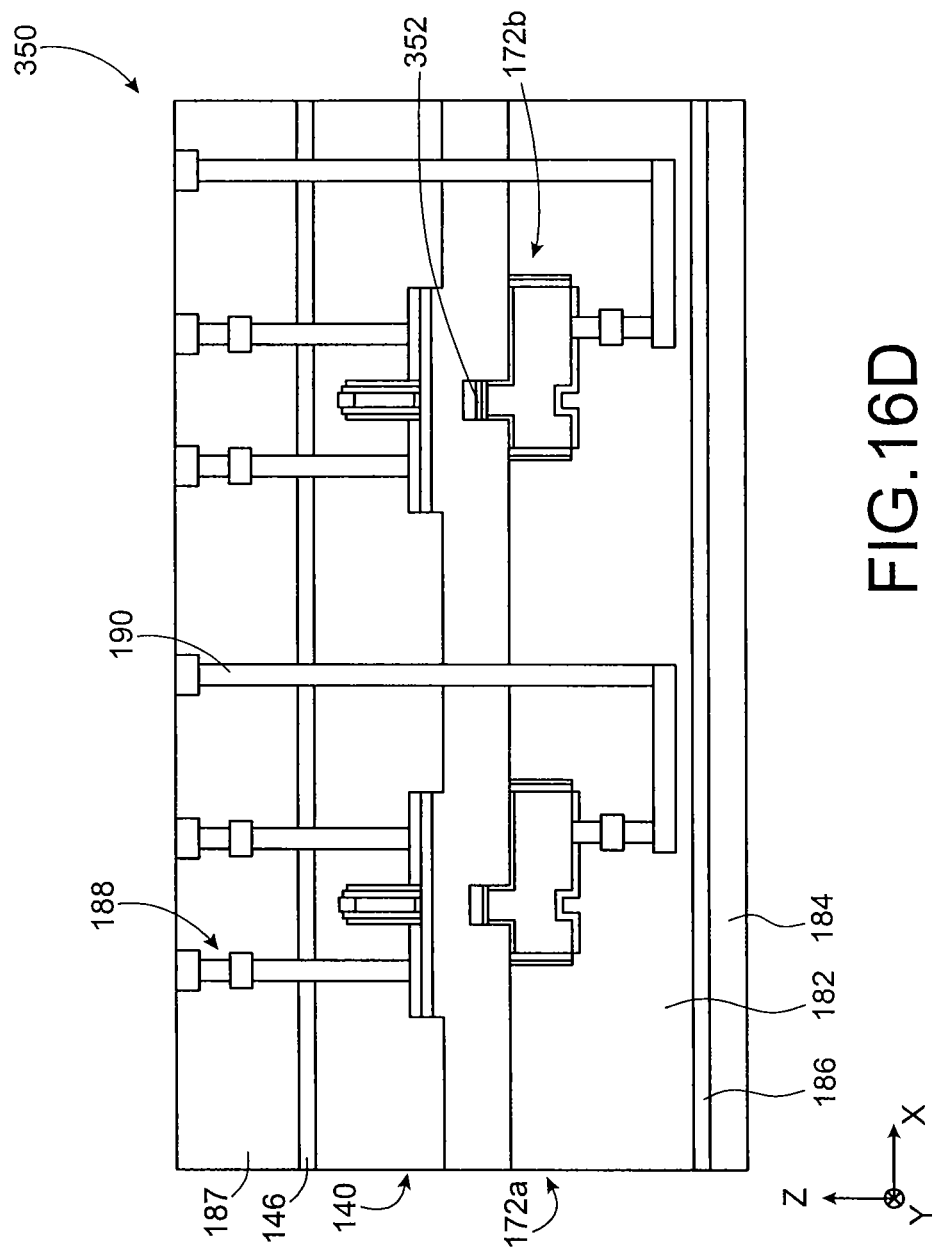

In another variant, it is possible for the epitaxy of SiGe not to be performed for the active areas of the first MOS transistors but for at least some of the second MOS transistors. In this variant, the steps previously described in relation to FIGS. 1 to 11 are implemented as previously described. The remaining portions of oxide 154 and nitride 156 are then eliminated, revealing the portions of silicon 152 intended to form the active areas of the second transistors. The portions of silicon 152 of the future second NMOS transistors are then masked. An epitaxy of SiGe 352 is then performed on the portions of silicon 152 of the future second PMOS transistors. The integrated circuit 350 obtained is shown in FIG. 16D and comprises first MOS transistors 140, second NMOS transistors 172*a* the active areas of which are composed of the semiconductor of the portions 152 and second PMOS transistors 172*b* the active areas of which are composed of the semiconductor of the portions 152 and the SiGe 352 obtained by epitaxy on the semiconductor of the portions 152.

As with the integrated circuit 300 previously described, it is possible to produce the second transistors so that the second PMOS transistors comprise active areas composed solely of the semiconductor of the portions 152 and second NMOS transistors the active areas of which are composed of the semiconductor of the portions 152 and the SiGe obtained by epitaxy on the semiconductor on the portions 152. In another variant, it is possible for the epitaxy of SiGe to be performed both for the second NMOS and PMOS transistors.

The production of a three-dimensional integrated circuit 400 according to a fourth embodiment is now described in relation to FIGS. 17A to 17E.

Figure 17A:
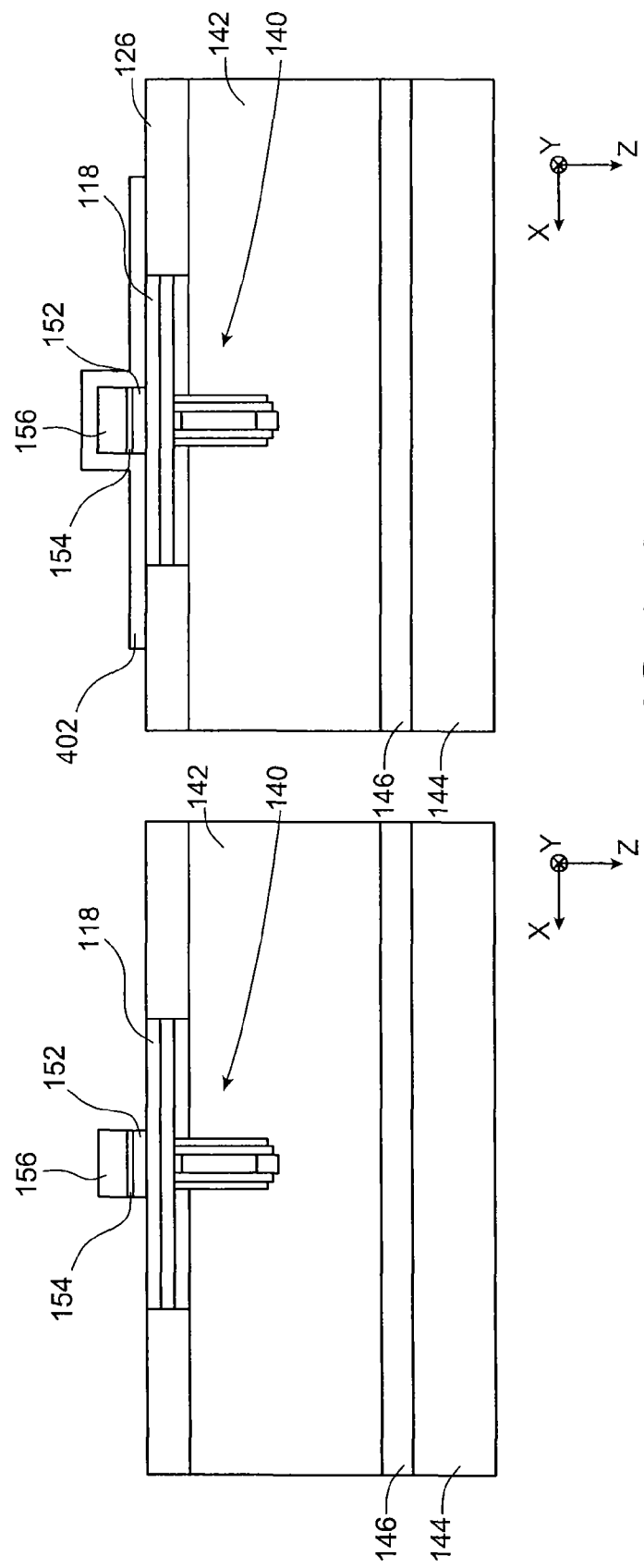
FIGS. 17A to 17E show some of the steps of a method of producing an integrated electronic circuit according to a fourth embodiment.

The steps previously described in relation to FIGS. 1 to 9G are first of all performed, forming the first MOS transistors and the future active areas of the second MOS transistors. In this fourth embodiment, at least some of the first and second MOS transistors are replaced by memory cells of the flash type. For this purpose, the second MOS transistors that it is wished to keep as transistors (as well as the first MOS transistors placed opposite the second transistors) are optionally covered with a mask 402 (FIG. 17A).

Figure 17B:
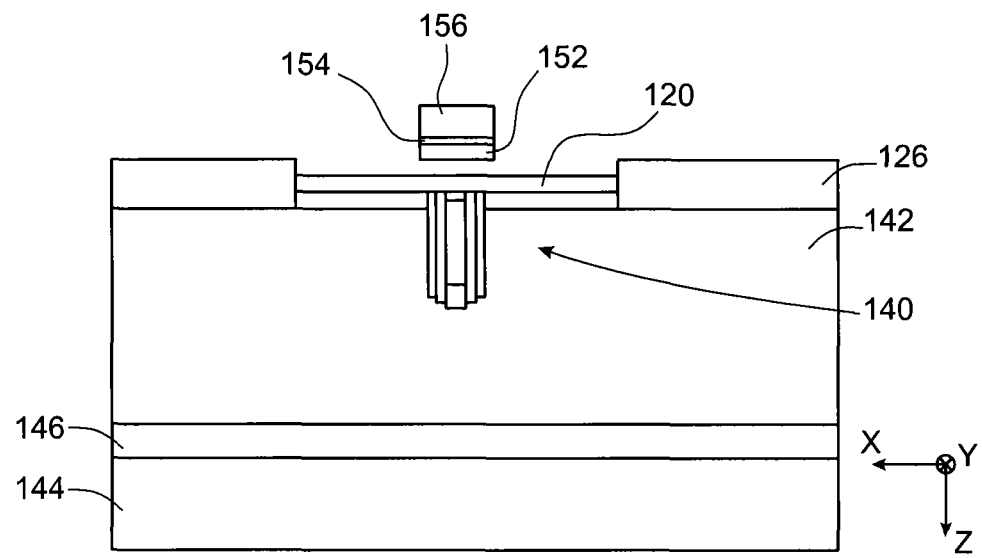
Figure 17C:
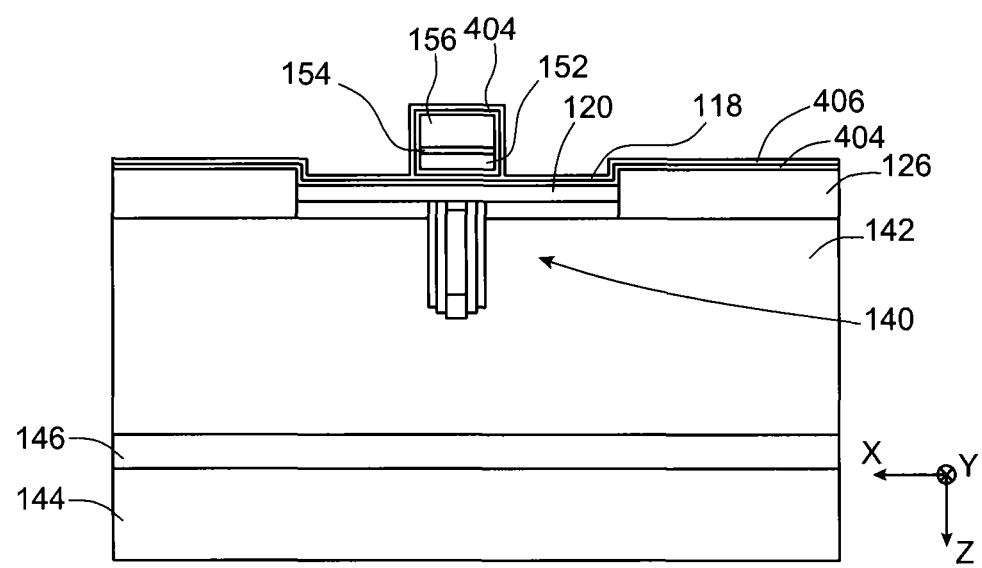

As shown in FIG. 17B, the portions 118 of SiGe are next etched at the MOS devices intended to form memory cells. A first layer of oxide 404 is deposited in a conforming manner on the assembly previously produced, covering in particular the portions of silicon 120 forming the active areas of the first MOS devices as well as the stacks of portions of material 152, 154 and 156. A second layer of nitride 406 is then deposited so as to cover the first layer of oxide 404 (FIG. 17C).

Figure 17D:
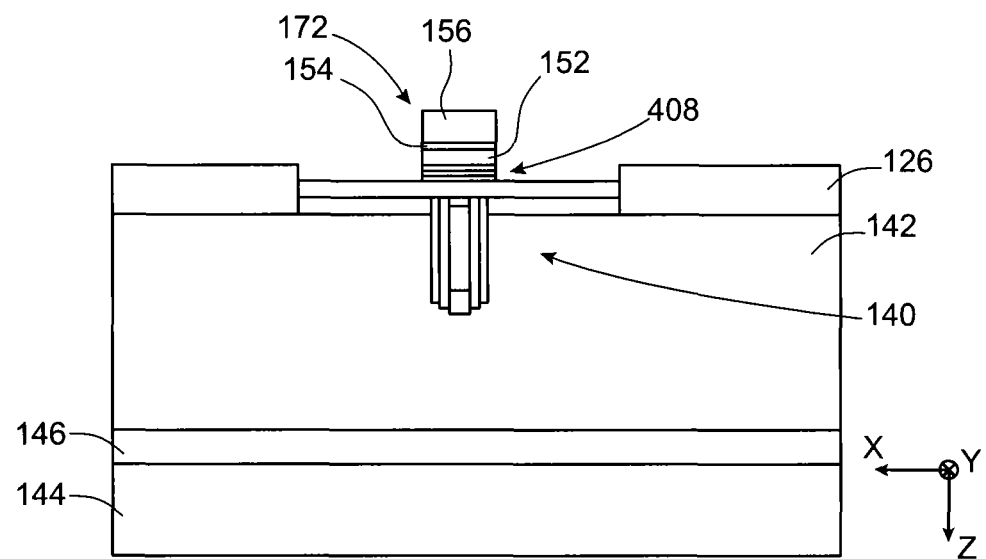

As shown in FIG. 17D, the layers 404 and 406 are then etched, only the portions of these layers situated between the silicon of the portion 152 and the silicon forming the active areas of the first MOS devices being kept, forming a memory stack 408 of the ONO type (oxide-nitride-oxide, the portion of nitride being intended to effect a retention of electrical charges corresponding to a storage of data).

Figure 17E:
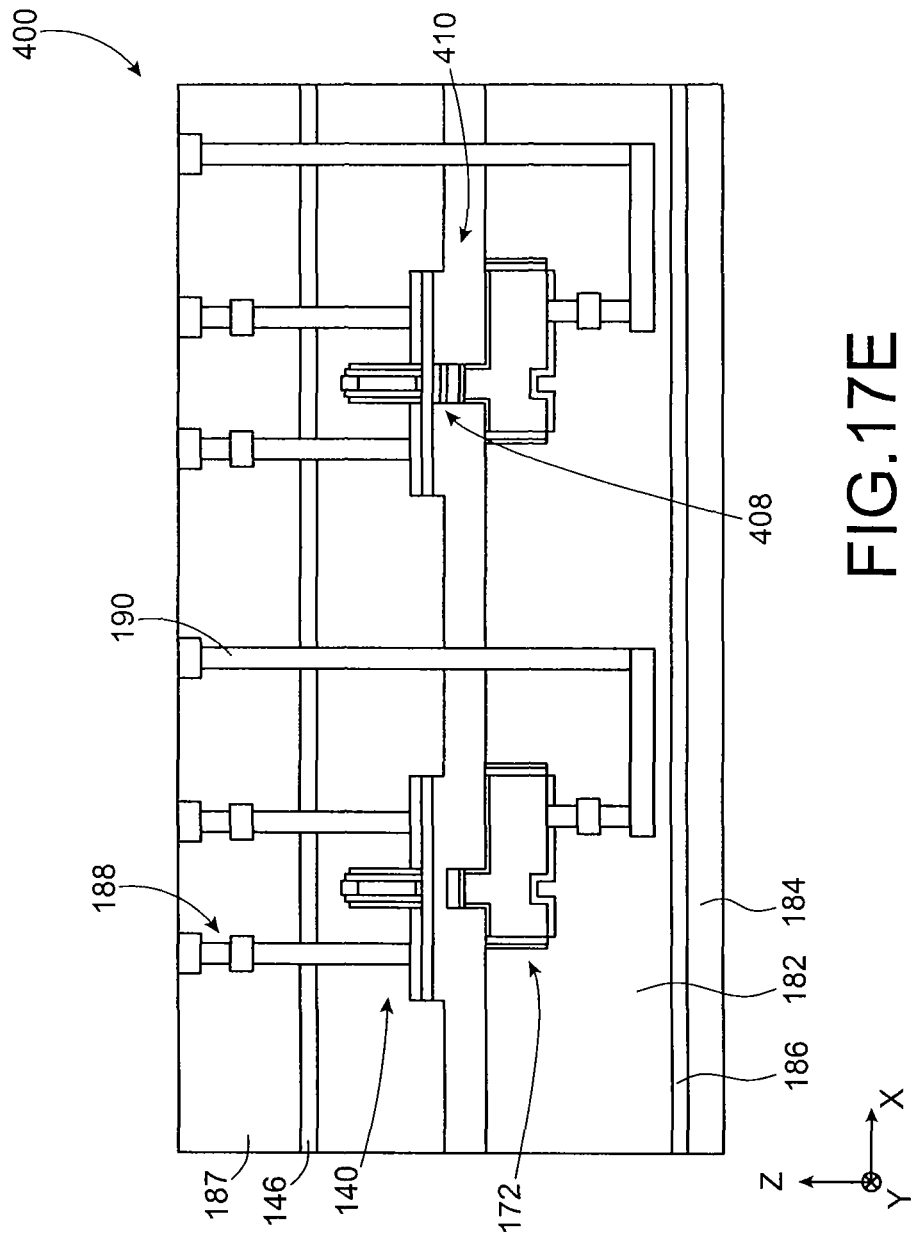

The integrated circuit 400 is then completed in a similar manner to the integrated circuit 100 according to the first embodiment (FIG. 17E). The integrated circuit 400 comprises first MOS transistors 140 and second MOS transistors 172, as well as memory cells of the flash type 410, each comprising MOS devices produced in the two MOS levels and a memory stack 408.

In a variant, it is possible for the integrated circuit 400 to comprise only memory cells of the flash type. In this case, the masking step previously described in relation to FIG. 17A is not implemented.

The production of a three-dimensional integrated circuit 500 according to a fifth embodiment, in which at least some of the first and second transistors have active areas auto-aligned with respect to each other, is now described in relation to FIGS. 18A to 18E.

First of all the steps previously described in relation to FIGS. 1, 2A and 2B are performed. The future first and second MOS transistors that are not intended to have their active areas auto-aligned with respect to each other are then masked. The second layer of semiconductor 106 is then etched according to the same pattern as that of the layers 108, 110, 112 and 114. Thus the active areas of the second transistors have a pattern similar to that of the areas of the first transistors.

Figure 18A:
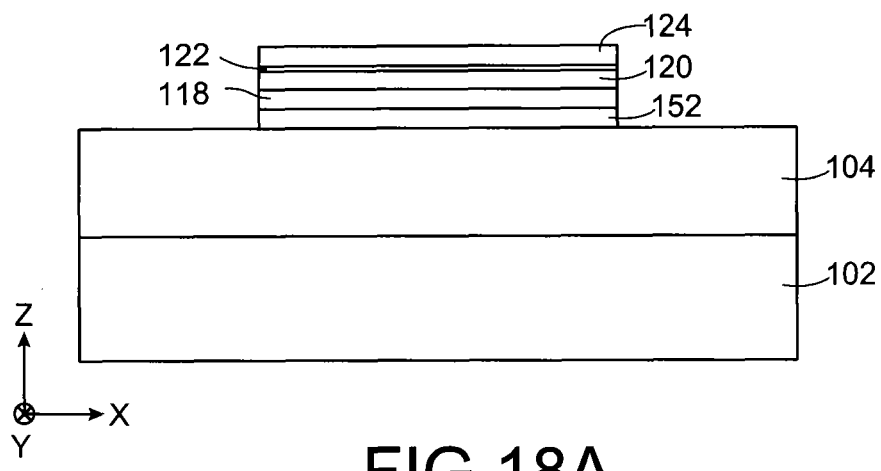
FIGS. 18A to 18E show some of the steps of a method of producing an integrated electronic circuit according to a fifth embodiment.
Figure 18B:
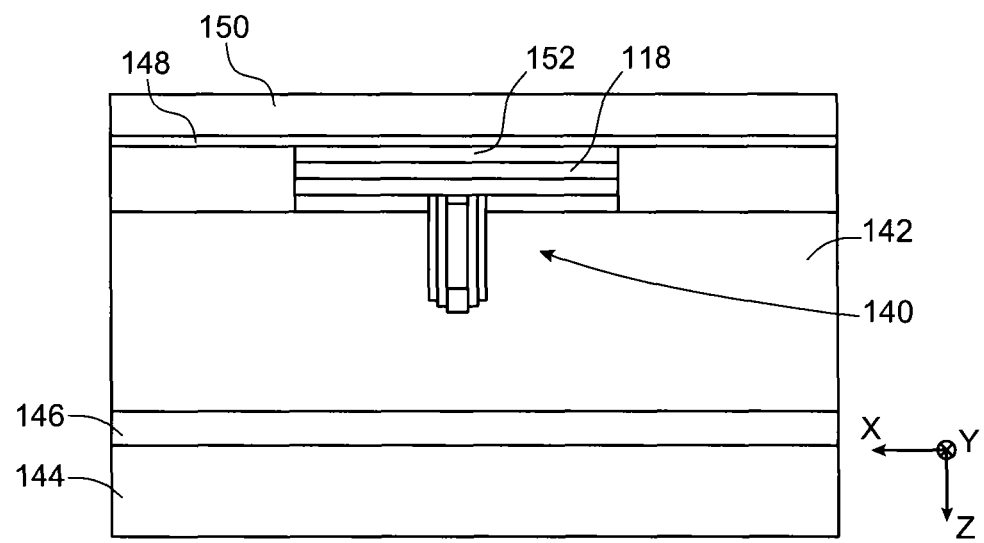

The steps previously described in relation to FIGS. 3 to 8 are then implemented in a similar manner, resulting in the structure shown in FIG. 18B.

Figure 18C:
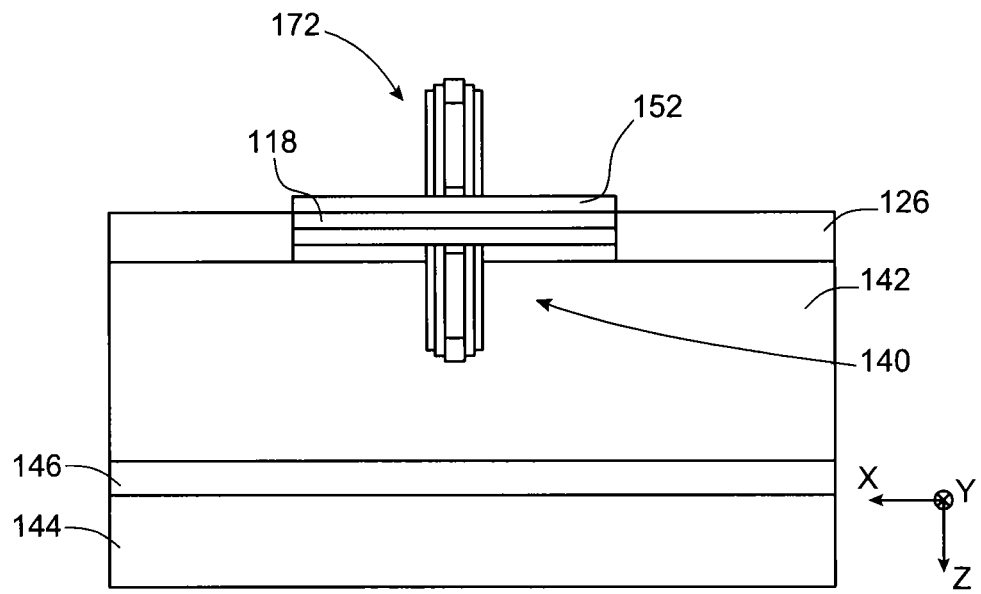

Given that the pattern of the portion of SiGe 118 is similar to that of the portion of semiconductor 152, it is not possible, unlike the previous embodiments, to etch this portion of SiGe before having produced and etched the gate materials of the second transistors, or after having produced the gate spacers of the second transistors by isotropic etching. As shown in FIG. 18C, the gates of the second transistors are then produced by implementing steps similar to those previously described in relation to FIGS. 5A and 5B (deposition and etching of a gate dielectric, a gate material, a hard mask, one or more spacers, etc). Given that the active areas of the first and second transistors are superimposed on each other in a similar pattern, the gates of the first and second transistors can be aligned and comprise a similar pattern.

Figure 18D:
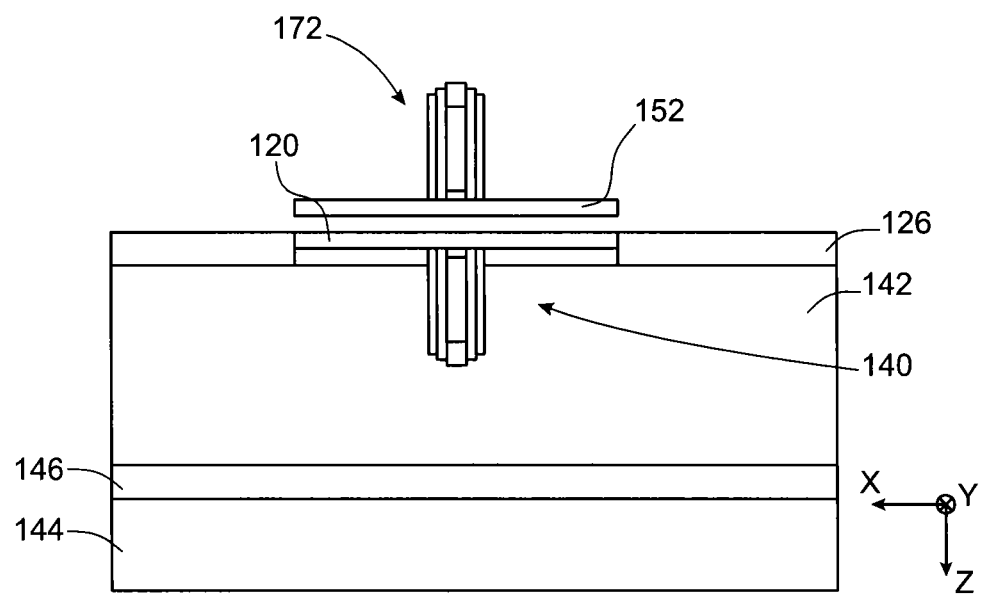

As shown in FIG. 18D, part of the dielectric portions 126 is etched in order to reveal at least part of the lateral flanks of the portion of sacrificial material 118. This portion of SiGe 118 is then etched by isotropic etching.

Figure 18E:
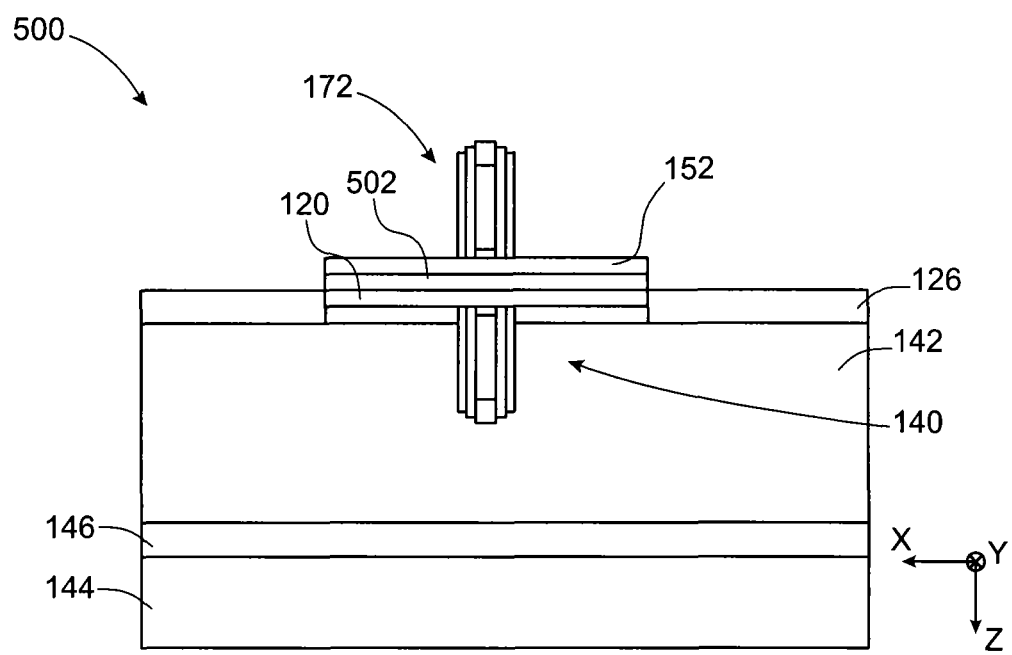

The space between the portions of semiconductor 120 and 152 forming the active areas of the first and second transistors, obtained by etching the portion of sacrificial material 118, is then filled by effecting a deposition of dielectric material and then a deoxidisation, keeping only a dielectric portion 502 the pattern of which is similar to that of the portions of semiconductor 120 and 152 (FIG. 18E). The integrated circuit 500 is then completed in a similar manner to the integrated circuit 100 previously described.

Whether or not the active areas are produced in an auto-aligned manner, it is possible to eliminate the portion of SiGe 118 only after having performed the etching of the gates of the second transistors or completed the etching of the spacers around the gates of the second transistors.

The production of a three-dimensional integrated circuit 600 according to a sixth embodiment is now described in relation to FIGS. 19A to 19D.

Figure 19A:
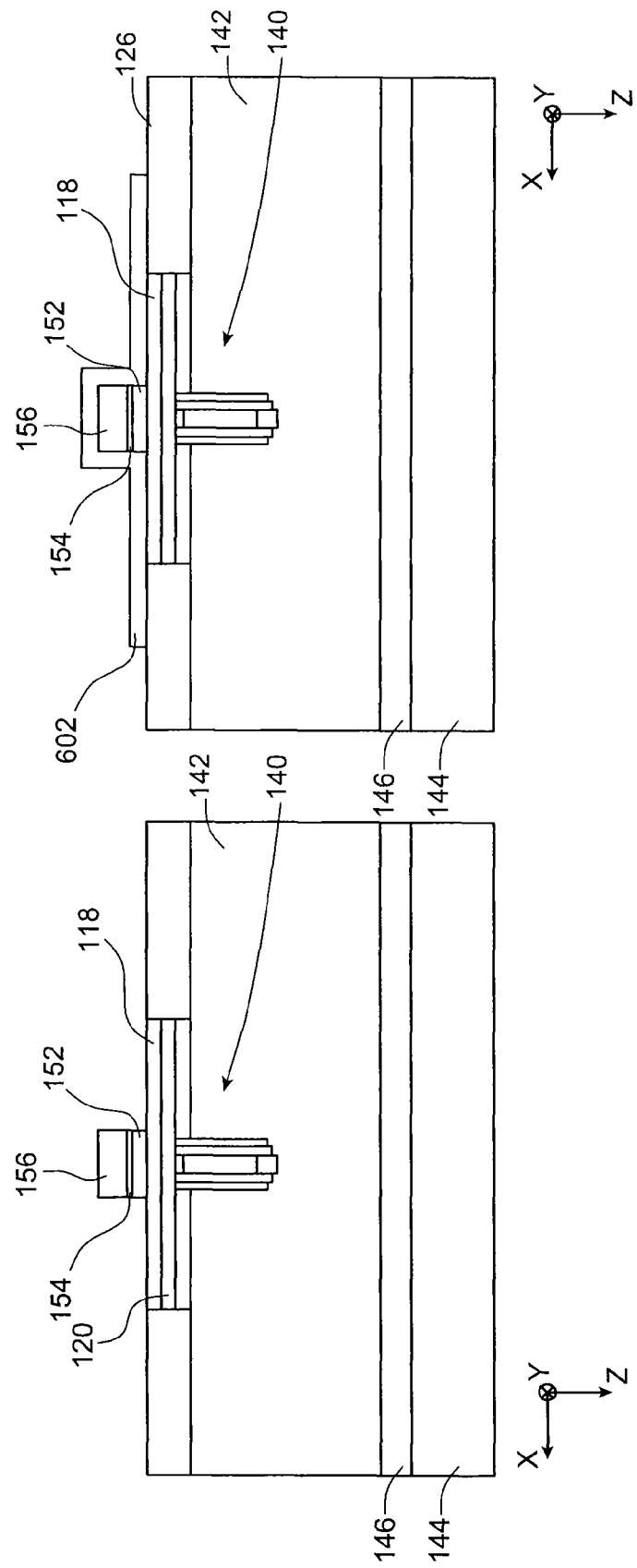
FIGS. 19A to 19D show some of the steps of a method of producing an integrated electronic circuit according to a sixth embodiment.

First of all the steps previously described in relation to FIGS. 1 to 9G are performed, forming the first MOS devices 140 and the future active areas of the second MOS devices 172. In this sixth embodiment, at least some of the first and second MOS devices are intended to comprise a ground plane, or floating gate. For this purpose, the second MOS devices 172 that are not intended to receive such a ground plane (as well as the first MOS devices placed opposite these second MOS devices) are optionally covered by a mask 602 (FIG. 19A).

Figure 19B:
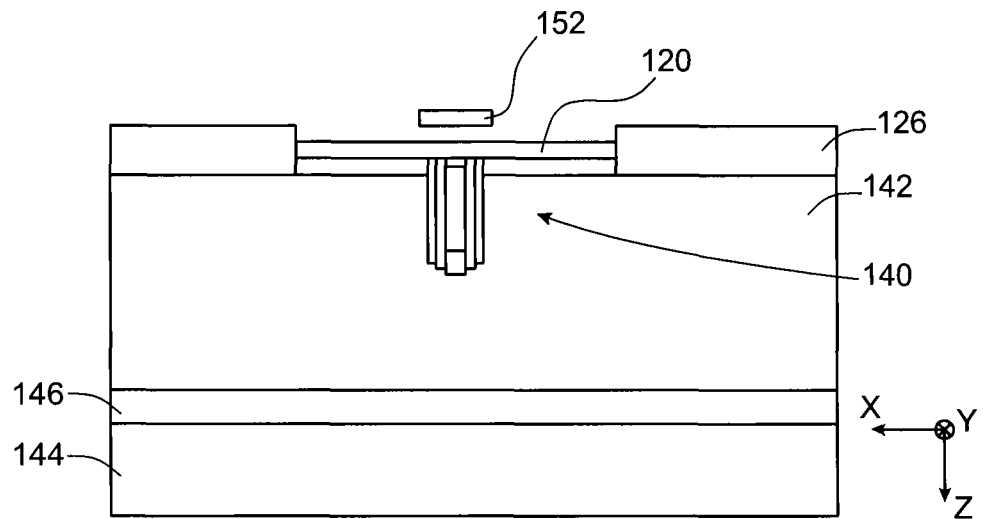

As shown in FIG. 19B, the portions of SiGe 118 at the MOS devices intended to comprise a ground plane are next etched. The portions of oxide and nitride 154 and 156 are also eliminated.

Figure 19C:
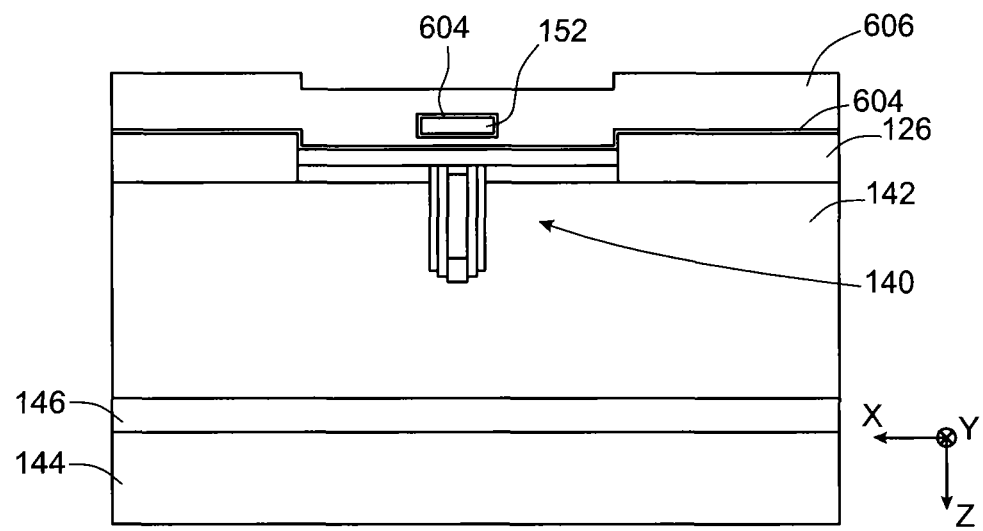

The mask 602 is next eliminated. The deposition of a dielectric material 604 intended to form the gate dielectrics of the second MOS transistors 174 and the deposition of a gate material 606 intended to form the gate of the second MOS transistors 174 are then effected. At the MOS devices intended to comprise a ground plane, in which the portions of sacrificial material 118 have been etched, the dielectric material 604 also covers the portions of semiconductor 120 and surrounds the portions of semiconductor 152, and the gate material 606 fills the remaining space previously occupied by the portions of SiGe 118 (FIG. 19C).

Figure 19D:
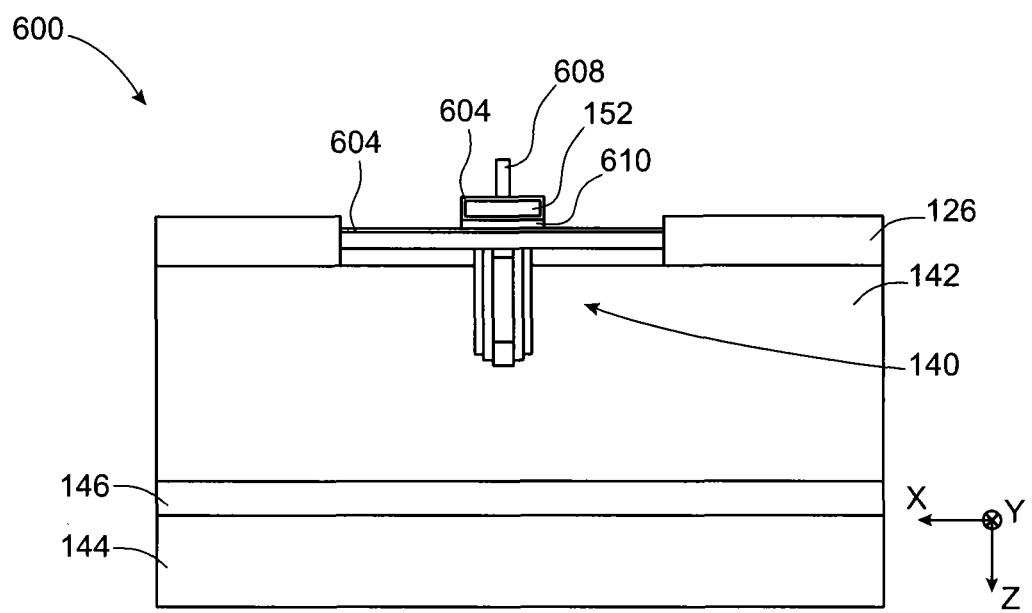

As shown in FIG. 19D, a lithography and etching (stripping) of the gate material 606 is carried out, forming the gate 608 of the second MOS transistors 172 but also a ground plane 610 composed of the gate material and etched according to a pattern corresponding to that of the portion of semiconductor 152 intended to form the active areas of the second MOS transistors 172. The integrated circuit 600 is then completed in a similar manner to the integrated circuit 100 previously described.

In the embodiments previously described, the two MOS devices of the integrated electronic circuit are shown with an angle of rotation of approximately 90° with respect to each other. The two MOS devices may however be completely aligned with respect to each other, without any angle of rotation with respect to each other.

The invention claimed is:

1. A method of producing an integrated electronic circuit comprising at least the steps of:
    producing a substrate comprising at least a first and second layer of semiconductor between which at least a third layer of material is placed, the at least a third layer being in contact with the first and second layers and having a different composition than the first and second layers, then
    producing at least a first MOS device, an active area of which is formed in at least part of the first layer of semiconductor, then
    producing at least a second MOS device, an active area of which is formed in at least part of the second layer of semiconductor, the active area of the second MOS device being placed between a gate of the second MOS device and the active area of the first MOS device.

2. The method according to claim 1, in which the first layer of semiconductor, the second layer of semiconductor and the at least a third layer of material are based on monocrystalline semiconductors produced by epitaxy.

3. The method according to claim 1, in which the at least a third layer is composed of at least SiGe or porous silicon.

4. The method according claim 1, in which the first and second MOS devices are transistors.

5. The method according to claim 1, further comprising, between the steps of producing the first and second MOS devices, the steps of:
    deposition of a dielectric material covering at least the first MOS device, and
    securing of said dielectric material against a second substrate.

6. The method according to claim 5, further comprising, after the production of the second MOS device, the steps of:
    deposition of a dielectric material covering the second MOS device, and
    production, at least in the dielectric material covering the second MOS device, of at least a first level of electrical connections and one or more vias electrically connecting the second MOS device to the first electrical connection level, the second MOS device being placed between the first electrical connection level and the first MOS device.

7. The method according to claim 6, further comprising, after the production of the first electrical connection level, the steps of:
    securing of the dielectric material covering the second MOS device against a third substrate,
    removal of the second substrate, and
    production, at least in a dielectric material covering the first MOS device, of at least a second electrical connection level and one or more vias electrically connecting the first MOS device to the second electrical connection level, the first MOS device being placed between the second electrical connection level and the second MOS device.

8. The method according to claim 1, in which, when the first MOS device is of the PMOS type, production of the first PMOS device comprises the implementation of an epitaxial growth of SiGe on the part of the first layer of semiconductor intended to form the active area of the first PMOS device, and/or, when the second MOS device is of the PMOS type, the production of the second PMOS device comprises the implementation of an epitaxial growth of SiGe on the part of the second layer of semiconductor intended to form the active area of the second PMOS device.

9. A method of producing an integrated electronic circuit comprising at least the steps of:
producing a substrate comprising at least a first and second layer of semiconductor, between which at least a third layer of material is placed, then
producing at least a first MOS device, an active area of which is formed in at least part of the first layer of semiconductor, then
producing at least a second MOS device, an active area of which is formed in at least part of the second layer of semiconductor, the active area of the second MOS device being placed between a gate of the second MOS device and the active area of the first MOS device when the first MOS device is produced, the first layer of semiconductor and the at least a third layer are etched according to a same pattern corresponding to the active area of the first MOS device.

10. The method according to claim 9, also comprising, when the second MOS device is produced, implementation of the steps of:
removal of a remaining portion of the at least a third layer etched according to the pattern corresponding to the active area of the first MOS device, and
deposition of a dielectric material at least between the active areas of the first and second MOS devices.

11. The method according to claim 9, also comprising, when the second MOS device is produced, implementation of the steps of:
removal of a remaining portion of the at least a third layer etched according to the pattern corresponding to the active area of the first MOS device, and
production, between the active areas of the first and second MOS devices, of a stack comprising a portion of electrically conductive material placed between two portions of dielectric material.

12. The method according to claim 9, also comprising, when the second MOS device is produced, implementation of the steps of:
removal of a remaining portion of the third at least a layer etched according to the pattern corresponding to the active area of the first MOS device, and
production, between the active areas of the first and second MOS devices, of a memory stack comprising a portion of material able to effect a retention of electrical charges placed between two portions of dielectric material, wherein the first and second MOS devices forming a memory cell.

13. A method of producing an integrated electronic circuit comprising at least the steps of:
producing a substrate comprising at least a first and second layer of semiconductor, between which at least a third layer of material is placed, then
producing at least a first MOS device, an active area of which is formed in at least part of the first layer of semiconductor, then
producing at least a second MOS device, an active area of which is formed in at least part of the second layer of semiconductor, the active area of the second MOS device being placed between a gate of the second MOS device and the active area of the first MOS device when the first MOS device is produced, the first and second layers of semiconductor and the at least a third layer are etched according to a same pattern corresponding to the active areas of the first and second MOS devices.

14. A method of producing an integrated electronic circuit comprising at least the steps of:
producing a substrate comprising at least a first and second layer of semiconductor, between which at least a third layer of material is placed, then
producing at least a first MOS device, an active area of which is formed in at least part of the first layer of semiconductor, then
producing at least a second MOS device, an active area of which is formed in at least part of the second layer of semiconductor, the active area of the second MOS device being placed between a gate of the second MOS device and the active area of the first MOS device, the at least a third layer comprises regions with different thicknesses such that, when the method comprises the production of several first MOS devices and several second MOS devices, the distances between the active areas of a first and second MOS device produced one above the other correspond to the various thicknesses of the at least a third layer.

15. The method according to claim 14, in which the at least a third layer that comprises regions of different thicknesses is obtained by performing several successive steps of epitaxy of the material of the at least a third layer on the second layer of semiconductor during which masks are produced on the epitaxially grown layers in order to form the regions of different thicknesses of the at least a third layer.

* * * * *